United States Patent
Kaneyasu

(10) Patent No.: US 10,651,203 B2
(45) Date of Patent: May 12, 2020

(54) SEMICONDUCTOR DEVICE COMPRISING A SENSING UNIT

(71) Applicant: Semiconductor Energy Laboratory Co., Ltd., Atsugi-shi, Kanagawa-ken (JP)

(72) Inventor: Makoto Kaneyasu, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 185 days.

(21) Appl. No.: 14/732,034

(22) Filed: Jun. 5, 2015

(65) Prior Publication Data

US 2015/0364496 A1    Dec. 17, 2015

(30) Foreign Application Priority Data

Jun. 13, 2014   (JP) ................. 2014-122090

(51) Int. Cl.
*H01L 27/12*   (2006.01)
*G06F 3/042*   (2006.01)
*G06F 3/044*   (2006.01)

(52) U.S. Cl.
CPC ........... *H01L 27/124* (2013.01); *G06F 3/042* (2013.01); *G06F 3/044* (2013.01);
(Continued)

(58) Field of Classification Search
None
See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1737044 A   12/2006
EP   2226847 A   9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — David D Davis
*Assistant Examiner* — John Bodnar
(74) *Attorney, Agent, or Firm* — Fish & Richardson P.C.

(57) ABSTRACT

To provide an input device and an input/output device with high detection sensitivity. The input device includes a first transistor, a second transistor, a capacitor, a node, a first wiring, a second wiring, a third wiring, and a fourth wiring. The first transistor includes a first gate and a second gate. The first and second gates of the first transistor overlap with each other with a semiconductor film therebetween. The second gate of the first transistor is electrically connected to the node. The first wiring is electrically connected to the second wiring through the first transistor. The third wiring is electrically connected to the node through the second transistor. A first terminal of the capacitor is electrically connected to the node, and a second terminal of the capacitor is electrically connected to the fourth wiring.

10 Claims, 12 Drawing Sheets

(52) U.S. Cl.
CPC ............... *G06F 2203/04102* (2013.01); *H01L 27/1225* (2013.01); *H01L 27/1255* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 * | 11/2007 | Hoffman ............ H01L 29/7869 257/43 |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,054,359 B2 | 11/2011 | Seol et al. |
| 9,312,421 B2 | 4/2016 | Yamada et al. |
| 9,721,981 B2 | 8/2017 | Sakano |
| 10,319,777 B2 | 6/2019 | Sakano |
| 2001/0046027 A1 | 11/2001 | Tai et al. |
| 2002/0056838 A1 | 5/2002 | Ogawa |
| 2002/0079512 A1 | 6/2002 | Yamazaki et al. |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0301326 A1 | 12/2010 | Miyairi et al. |
| 2011/0024740 A1 * | 2/2011 | Yamazaki ............ H01L 27/1225 257/43 |
| 2011/0128777 A1 * | 6/2011 | Yamazaki ............ G11C 11/405 365/149 |
| 2011/0187410 A1 * | 8/2011 | Kato .................. G11C 14/0054 326/46 |
| 2013/0069068 A1 * | 3/2013 | Miyake .................. H01L 27/06 257/59 |
| 2013/0135943 A1 * | 5/2013 | Ohmaru .................. G11C 7/12 365/189.05 |
| 2015/0103037 A1 * | 4/2015 | Wu ...................... G09G 3/3233 345/174 |
| 2019/0333958 A1 | 10/2019 | Sakano |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-287900 A | 10/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-050472 A | 2/2006 |
| JP | 2006-330578 A | 12/2006 |
| JP | 2009-003414 A | 1/2009 |
| JP | 2009-260210 A | 11/2009 |
| JP | 2010-145583 A | 7/2010 |
| JP | 2012-137753 A | 7/2012 |
| JP | 2013-012696 A | 1/2013 |
| JP | 2015-032999 A | 2/2015 |

(56) References Cited

FOREIGN PATENT DOCUMENTS

| WO | WO-2004/114391 | 12/2004 |
|---|---|---|
| WO | WO-2015/015741 | 2/2015 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-25430
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters), 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physical Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 3A
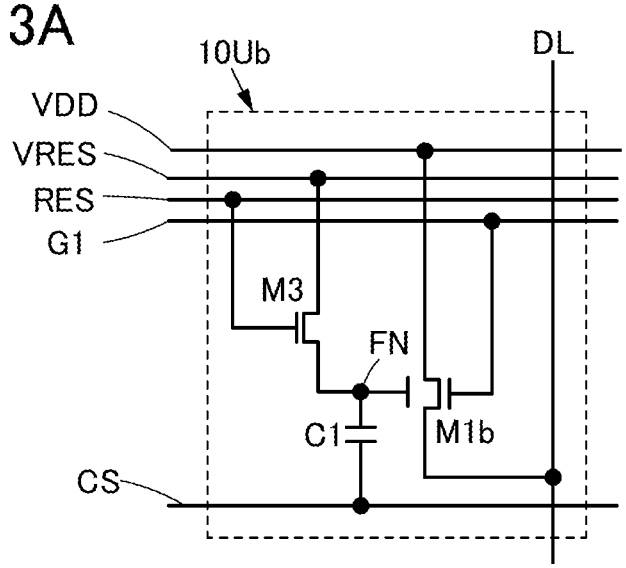
FIG. 3B1
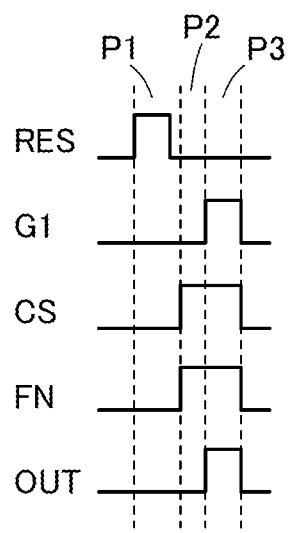
FIG. 3B2
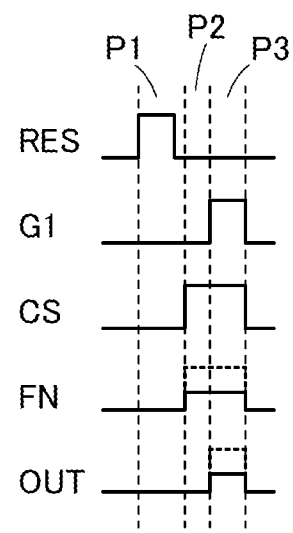

FIG. 5A
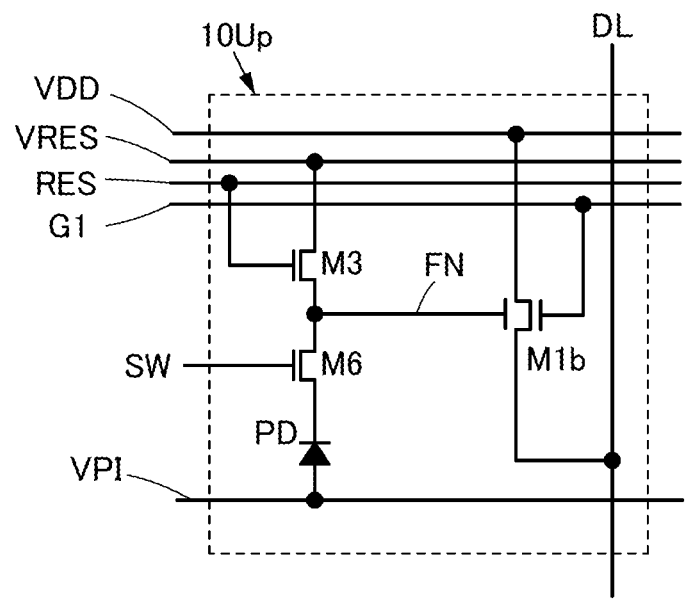
FIG. 5B1
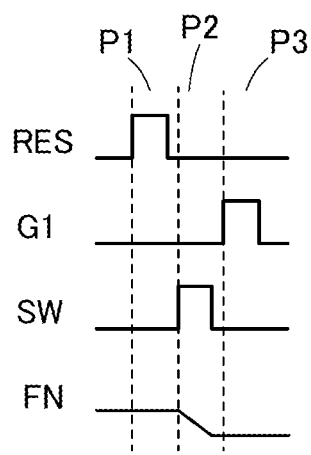
FIG. 5B2
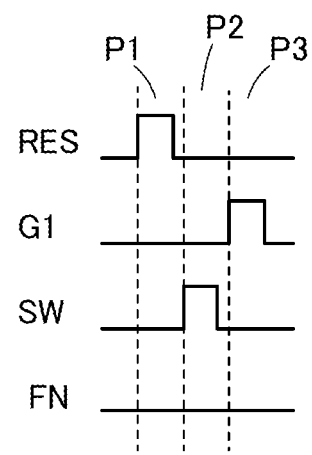

SEMICONDUCTOR DEVICE COMPRISING A SENSING UNIT

BACKGROUND OF THE INVENTION

1. Field of the Invention

One embodiment of the present invention relates to an input device and an input/output device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a storage device, an electronic appliance, a lighting device, an input device, an input/output device, a sensing device, a driving method thereof, and a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

In recent years, portable information terminals such as smartphones and tablet terminals have been widely used. Most of the portable information terminals are provided with active matrix display devices and input devices such as touch panels.

For example, a display device in which an input portion is provided in a display portion is known (Patent Document 1).

REFERENCE

Patent Document

Patent Document 1: Japanese Published Patent Application No. 2002-287900

SUMMARY OF THE INVENTION

An object of one embodiment of the present invention is to provide an input device with high detection sensitivity. Another object of one embodiment of the present invention is to provide an input/output device with high detection sensitivity. Another object of one embodiment of the present invention is to provide a highly reliable input device. Another object of one embodiment of the present invention is to provide a highly reliable input/output device. Another object of one embodiment of the present invention is to provide a novel input device. Another object of one embodiment of the present invention is to provide a novel input/output device. Another object of one embodiment of the present invention is to provide a novel semiconductor device. Another object of one embodiment of the present invention is to provide a novel display device.

Note that the description of a plurality of objects does not disturb the existence of each object. Note that one embodiment of the present invention does not necessarily achieve all the objects listed above. Objects other than those listed above are apparent from the description of the specification, drawings, and claims, and also such objects could be an object of one embodiment of the present invention.

One embodiment of the present invention is an input device that includes a first transistor, a second transistor, a capacitor, a node, a first wiring, a second wiring, a third wiring, and a fourth wiring. The first transistor includes a first gate and a second gate. The first gate of the first transistor and the second gate of the first transistor overlap with each other with a semiconductor film therebetween. The second gate of the first transistor is electrically connected to the node. The first wiring is electrically connected to the second wiring through the first transistor. The third wiring is electrically connected to the node through the second transistor. A first terminal of the capacitor is electrically connected to the node. A second terminal of the capacitor is electrically connected to the fourth wiring.

In the above embodiment, the potential of the node changes by the approach or touch of a finger; the threshold voltage of the first transistor changes by the change in the potential of the node; current flowing between the first wiring and the second wiring changes by the change in the threshold voltage of the first transistor; and input can be sensed by reading the change in the current flowing between the first wiring and the second wiring.

In the above embodiment, each of the first transistor and the second transistor preferably includes an oxide semiconductor in a channel.

One embodiment of the present invention is an input device that includes a first transistor, a second transistor, a third transistor, a photodiode, a node, a first wiring, a second wiring, a third wiring, and a fourth wiring. The first transistor includes a first gate and a second gate. The first gate of the first transistor and the second gate of the first transistor overlap with each other with a semiconductor film therebetween. The second gate of the first transistor is electrically connected to the node. The first wiring is electrically connected to the second wiring through the first transistor. The third wiring is electrically connected to the node through the second transistor. A first terminal of the photodiode is electrically connected to the node through the third transistor. A second terminal of the photodiode is electrically connected to the fourth wiring.

In the above embodiment, the potential of the node changes when a finger blocks light with which the photodiode is irradiated; the threshold voltage of the first transistor changes when the potential of the node changes; current flowing between the first wiring and the second wiring changes when the threshold voltage of the first transistor changes; and input can be sensed by reading the change in the current flowing between the first wiring and the second wiring.

In the above embodiment, each of the first to third transistors preferably includes an oxide semiconductor in a channel.

Another embodiment of the present invention is an input/output device that includes the input device according to any of the above embodiments and a display portion.

Another embodiment of the present invention is an electronic appliance that includes the input device according to any of the above embodiments or the input/output device according to the above embodiment and at least one of a microphone, a speaker, and an operation button.

According to one embodiment of the present invention, an input device with high detection sensitivity can be provided. According to one embodiment of the present invention, an input/output device with high detection sensitivity can be provided. According to one embodiment of the present invention, a highly reliable input device can be provided. According to one embodiment of the present invention, a highly reliable input/output device can be provided. According to one embodiment of the present invention, a novel input device can be provided. According to one embodiment of the present invention, a novel input/output device can be provided. According to one embodiment of the present invention, a novel semiconductor device can be provided. According to one embodiment of the present invention, a novel display device can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 1A, 1B, 1C, 1D-1, and 1D-2 illustrate examples of structures of an input device and a converter and an example of a method for driving the input device.

FIG. 2 illustrates an example of a converter.

FIGS. 3A, 3B-1, and 3B-2 illustrate an example of a circuit configuration of a sensing unit and an example of a method for driving the sensing unit.

FIGS. 5A, 5B-1, and 5B-2 illustrate an example of a circuit configuration of a sensing unit and an example of a method for driving the sensing unit.

DETAILED DESCRIPTION OF THE INVENTION

Figure 1:
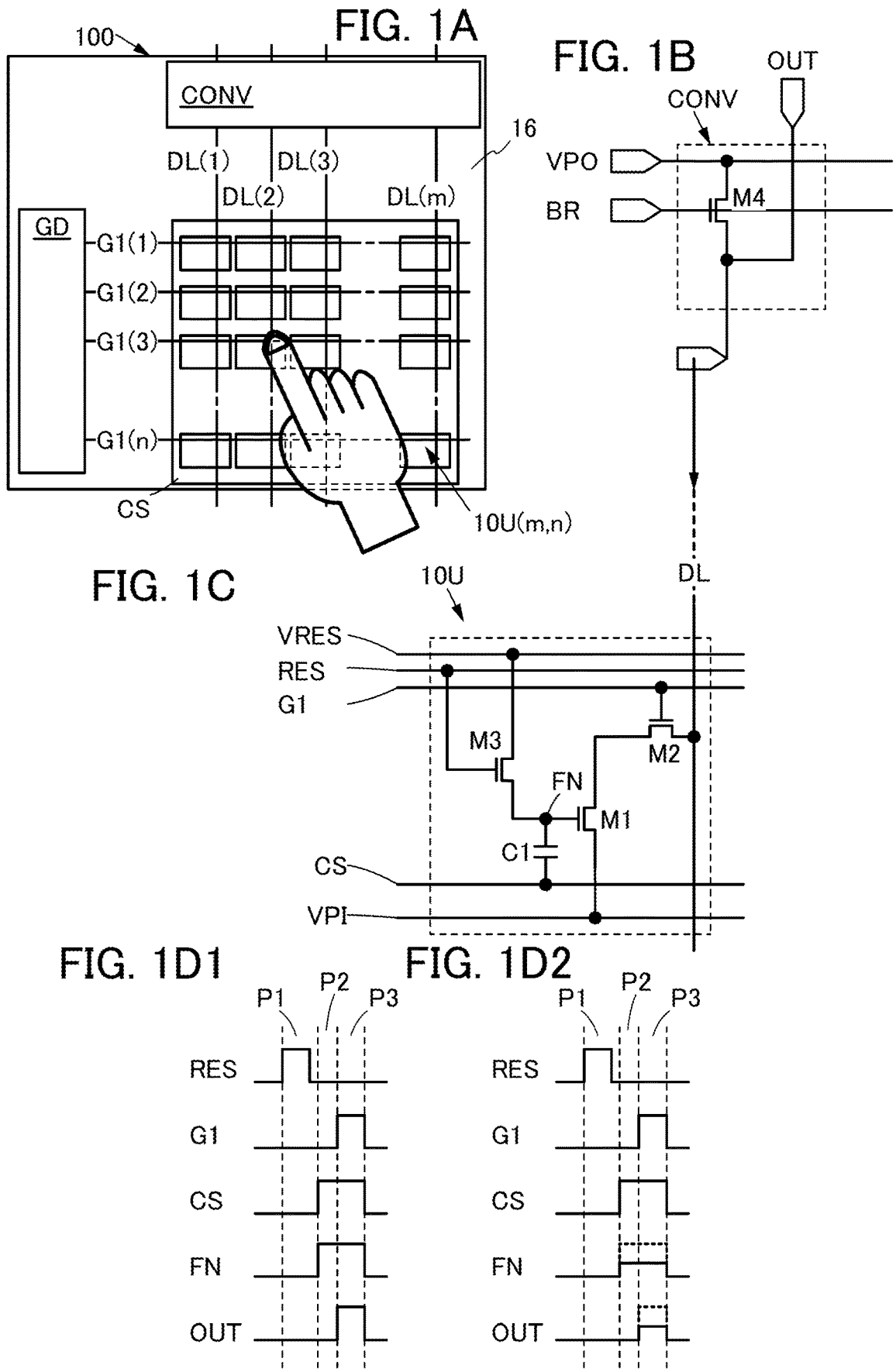

Embodiments of the present invention will be described below in detail with reference to the drawings. Note that the present invention is not limited to the description below, and it is easily understood by those skilled in the art that modes and details of the present invention can be modified in various ways without departing from the spirit and scope of the present invention. Therefore, the embodiments of the present invention should not be construed as being limited to the description of the embodiment. In addition, in the following embodiments, the same portions or portions having similar functions are denoted by the same reference numerals in different drawings, and description thereof will not be repeated.

In the drawings, the size, the layer thickness, or the region is exaggerated for clarity in some cases. Therefore, embodiments of the present invention are not limited to such scales.

Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source. Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

In addition, in this specification, "node" refers to any point on a wiring provided to connect elements electrically.

Note that in this specification, ordinal numbers such as "first", "second", and "third" are used in order to avoid confusion among components, and thus do not limit the number of the components.

Note that in this specification, the expression "A and B are connected" or "A is connected to B" means the case where A and B are electrically connected to each other as well as the case where A and B are directly connected to each other. Here, the expression "A and B are electrically connected" means the case where electric signals can be transmitted and received between A and B when an object having any electric action exists between A and B.

Note that the positional relations of circuit blocks in a drawing are specified for description. Even when a drawing shows that different functions are achieved by different circuit blocks, an actual circuit or region may be configured so that the different functions are achieved in the same circuit block. Furthermore, the function of each circuit block in a drawing is specified for description. Thus, even when one circuit block is illustrated, an actual circuit or region may be configured so that processing which is illustrated as being performed in the one circuit block is performed in a plurality of circuit blocks.

Embodiment 1

In this embodiment, a structure of an input device that can be used as one embodiment of the present invention is described with reference to FIGS. 1A, 1B, 1C, 1D-1, and 1D-2, FIG. 2, FIGS. 3A, 3B-1, and 3B-2, FIGS. 4A and 4B, FIGS. 5A, 5B-1, and 5B-2, FIG. 6, and FIG. 7.

FIGS. 1A, 1B, 1C, 1D-1, and 1D-2 illustrate a structure of an input device 100 of one embodiment of the present invention.

Figure 2:
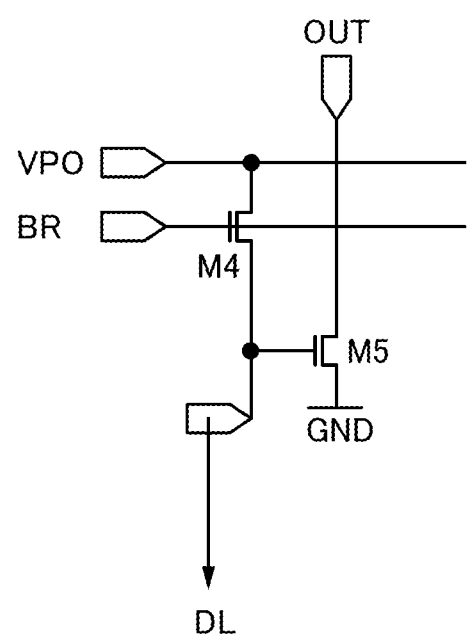

FIG. 1A is a block diagram illustrating the structure of the input device 100 of one embodiment of the present invention. FIG. 1B is a circuit diagram illustrating a structure of a converter CONV. FIG. 1C is a circuit diagram illustrating a structure of a sensing unit 10U. FIGS. 1D-1 and 1D-2 are timing charts showing a method for driving the sensing unit 10U.

The input device 100 described in this embodiment includes a plurality of sensing units 10U arranged in a matrix, wirings G1 to which the plurality of sensing units 10U arranged in the row direction are electrically connected, a driver circuit GD to which the wirings G1 are electrically connected, wirings DL to which the plurality of sensing units 10U arranged in the column direction are electrically connected, the converter CONV to which the wirings DL are electrically connected, and a base 16 provided with the sensing units 10U, the driver circuit GD, the converter CONV, the wirings G1, and the wirings DL (see FIG. 1A).

For example, the plurality of sensing units 10U can be arranged in a matrix of m rows and n columns (m and n are natural numbers greater than or equal to 1).

<Sensing Unit 10U>

The sensing unit 10U of one embodiment of the present invention includes a transistor M1, a transistor M2, a transistor M3, a capacitor C1, and a node FN (see FIG. 1C).

The sensing unit 10U is electrically connected to a wiring VRES, a wiring RES, a wiring VPI, a wiring CS, the wiring G1, and the wiring DL.

A gate of the transistor M1 is electrically connected to the node FN, one of a source and a drain of the transistor M1 is electrically connected to the wiring VPI, and the other of the source and the drain of the transistor M1 is electrically connected to one of a source and a drain of the transistor M2.

A gate of the transistor M2 is electrically connected to the wiring G1. The other of the source and the drain of the transistor M2 is electrically connected to the wiring DL.

A gate of the transistor M3 is electrically connected to the wiring RES. One of a source and a drain of the transistor M3 is electrically connected to the node FN, and the other of the source and the drain of the transistor M3 is electrically connected to the wiring VRES.

A first terminal of the capacitor C1 is electrically connected to the node FN, and a second terminal of the capacitor C1 is electrically connected to the wiring CS.

Note that in the following description, the transistors M1 to M3 are n-channel transistors.

The transistors M1 to M3 each include a semiconductor layer. For example, a Group 14 element, a compound semiconductor, or an oxide semiconductor can be used for the semiconductor layer. Specifically, a semiconductor containing silicon, a semiconductor containing gallium arsenide, an oxide semiconductor containing indium, or the like can be used.

The wiring VPI can supply, for example, a ground potential (or a low power supply potential). The wiring VPI may supply a high power supply potential in some cases.

The wiring G1 has a function as a scan line and can supply a selection signal. For example, the selection signal can turn on the transistor M2.

The wiring DL has a function as a signal line and can supply, for example, a sensing signal DATA.

The wiring RES can supply a reset signal. For example, the reset signal can turn on the transistor M3.

The wiring VRES can supply, for example, a potential at which the transistor M1 can be turned on.

The wiring CS can supply a control signal by which the potential of the second terminal of the capacitor C1 is controlled.

<Convertor CONV>

The converter CONV includes a conversion circuit. Any of a variety of circuits that can convert the sensing signal DATA and supply the converted signal to a terminal OUT can be used as the converter CONV. For example, the converter CONV may be electrically connected to the sensing unit 10U to form a source follower circuit, a current mirror circuit, or the like.

Specifically, a source follower circuit can be configured with the converter CONV including a transistor M4 (see FIG. 1B). Note that the transistor M4 may be formed through the same process as the transistors M1 to M3.

A wiring VPO and a wiring BR can supply, for example, a high power supply potential sufficient to turn on a transistor.

The terminal OUT can supply a signal converted on the basis of the sensing signal DATA.

Alternatively, a source follower circuit may be configured with a converter CONV including a transistor M5 (see FIG. 2). In FIG. 2, a wiring GND is preferably supplied with a ground potential (or a low power supply potential). Note that the transistor M5 may be formed through the same process as the transistors M1 to M4.

A method for driving the sensing unit 10U is described.

<<First Step>>

In a first step, a reset signal for turning on the transistor M3 and subsequently turning off the transistor M3 is supplied to the wiring RES, so that the potential of the node FN is set to, for example, a potential at which the transistor M1 can be turned on (see Period P1 in FIG. 1D-1).

<<Second Step>>

In a second step, a control signal is supplied to the second terminal of the capacitor C1. Specifically, a rectangular wave control signal is supplied to the wiring CS. The capacitor C1 supplied with the rectangular wave control signal increases the potential of the node FN in accordance with the capacitance of the capacitor C1 (see Period P2 in FIG. 1D-1).

In that case, when an object having a higher dielectric constant than the air, such as a finger, approaches or touches a conductive film, the potential of the node FN is reduced due to the capacitance between the finger and the conductive film as compared to the case where nothing approaches or touches the conductive film (see a solid line in FIG. 1D-2).

The potential change of the node FN leads to a potential change of the gate of the transistor M1.

<<Third Step>>

In a third step, a selection signal for turning on the transistor M2 is supplied to the wiring G1. The other of the source and the drain of the transistor M1 is electrically connected to the wiring DL (see Period P3 in FIG. 1D-1).

<<Fourth Step>>

In a fourth step, a signal is supplied to the wiring DL. This signal includes, as data, the amount of change in the on-state current of the transistor M1 (current flowing between the wiring VPI and the wiring DL).

The converter CONV converts the amount of change in current flowing through the wiring DL into the amount of voltage change and supplied the amount of voltage change.

The input device 100 can detect the potential change of the node FN by reading the amount of the change in current, whereby the input device 100 can sense the approach or touch of a finger or the like.

<<Fifth Step>>

In a fifth step, a selection signal for turning off the transistor M2 is supplied to the gate of the transistor M2.

The first to fifth steps are repeated for every row of the wirings G1(1) to G1(*n*).

Another Structure Example

Figure 4A:
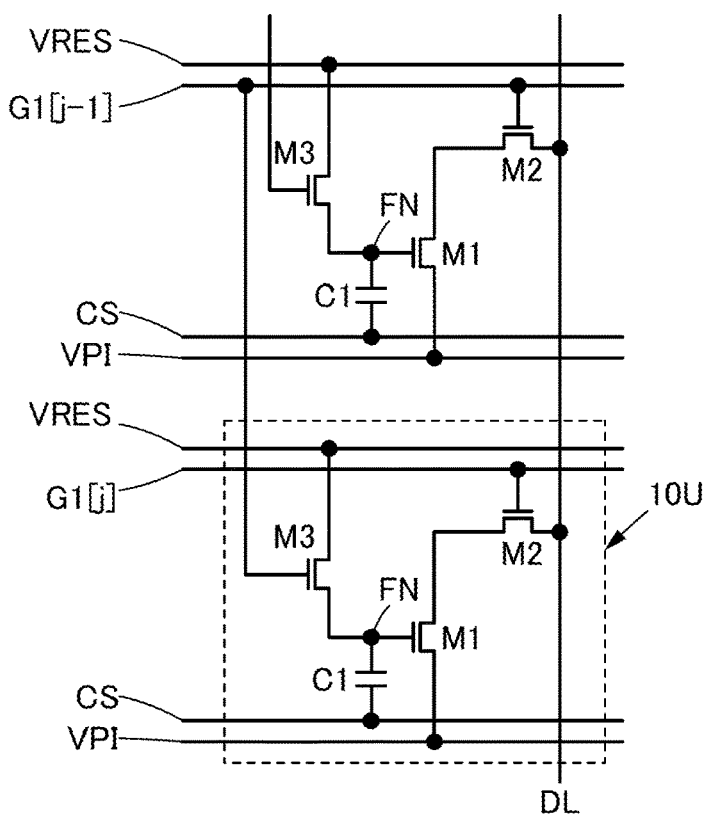
FIGS. 4A and 4B each illustrate an example of a sensing unit.

The gate of the transistor M3 in the sensing unit 10U may also be electrically connected to a wiring G1[j−1] (j is a natural number greater than or equal to 2) in the next row (see FIG. 4A). The circuit configuration illustrated in FIG. 4A allows the sensing unit 10U in the j-th row to be refreshed at the same time as the selection of the sensing unit 10U in the [j−1]-th row. In addition, the wiring RES, which is provided in the circuit illustrated in FIG. 1C, can be omitted in the circuit illustrated in FIG. 4A; thus, the circuit configuration can be simplified and the area occupied by the sensing unit 10U can be reduced.

<Sensing Unit 10Ub>

The sensing unit 10U can have a circuit configuration illustrated in FIG. 3A as well as the circuit configuration illustrated in FIG. 1C.

A sensing unit 10Ub illustrated in FIG. 3A differs from the sensing unit 10U illustrated in FIG. 1C in that a transistor M1b is provided instead of the transistor M1 and the transistor M2 and a wiring VDD is provided instead of the wiring VPI.

The transistor M1b includes a first gate and a second gate. The first gate and the second gate overlap with each other with a semiconductor film therebetween. The first gate and the second gate may be supplied with the same potential or different potentials at the same time.

The first gate of the transistor M1b is electrically connected to the wiring G1, the second gate of the transistor M1b is electrically connected to the node FN, one of a source and a drain of the transistor M1b is electrically connected to the wiring DL, and the other of the source and the drain of the transistor M1b is electrically connected to the wiring VDD.

In the description of this embodiment, the transistor M1b is an n-channel transistor.

The transistor M1b also includes a semiconductor layer. For example, a Group 14 element, a compound semiconductor, or an oxide semiconductor can be used for the semiconductor layer. Specifically, a semiconductor containing silicon, a semiconductor containing gallium arsenide, an oxide semiconductor containing indium, or the like can be used.

The wiring VDD may supply, for example, a ground potential (or a low power supply potential) or a high power supply potential.

Next, a method for driving the sensing unit 10Ub is described.

<<First Step>>

In a first step, a reset signal for turning on the transistor M3 and subsequently turning off the transistor M3 is supplied to the wiring RES, so that the potential of the node FN is set to a predetermined potential (see Period P1 in FIG. 3B-1).

<<Second Step>>

In a second step, a control signal is supplied to the second terminal of the capacitor C1. Specifically, a rectangular wave control signal is supplied to the wiring CS. The capacitor C1 supplied with the rectangular wave control signal increases the potential of the node FN in accordance with the capacitance of the capacitor C1 (see Period P2 in FIG. 3B-1).

In that case, when an object having a higher dielectric constant than the air, such as a finger, approaches or touches a conductive film, the potential of the node FN is reduced due to the capacitance between the finger and the conductive film as compared to the case where nothing approaches or touches the conductive film (see a solid line in FIG. 3B-2).

The potential change of the node FN directly leads to a potential change of the second gate of the transistor M1b. The threshold voltage of the transistor M1b changes in response to a potential supplied to the second gate. For example, in the case where the potential of the node FN increases, the threshold voltage of the transistor M1b shifts in the negative direction. As a result, the on-state current when the transistor M1b is turned on increases. In contrast, in the case where the potential of the node FN decreases, the threshold voltage of the transistor M1b shifts in the positive direction. As a result, the on-state current when the transistor M1b is turned on decreases.

<<Third Step>>

In a third step, a selection signal for turning on the transistor M1b is supplied to the wiring G1 (see Period P3 in FIG. 3B-1).

<<Fourth Step>>

In a fourth step, a signal is supplied to the wiring DL. This signal includes, as data, a change in the on-state current of the transistor M1b (current flowing between the wiring VDD and the wiring DL).

The converter CONV converts the amount of change in current flowing through the wiring DL into the amount of voltage change and supplied the amount of voltage change.

The input device 100 can detect the potential change of the node FN by reading the amount of change in the current, whereby the input device 100 can sense the approach or touch of a finger or the like.

<<Fifth Step>>

In a fifth step, a selection signal for turning off the transistor M1b is supplied to the gate of the transistor M1b.

The first to fifth steps are repeated for every row of the wirings G1(1) to G1(n).

Since the sensing unit 10Ub illustrated in FIG. 3A includes a smaller number of transistors than the sensing unit 10U illustrated in FIG. 1C, the area occupied by the sensing unit 10Ub can be reduced and an input device with higher resolution can be provided. In addition, since the sensing unit 10Ub includes a small number of transistors, malfunction of circuit operation due to variation in threshold voltage among the transistors is less likely to occur. Thus, highly reliable sensing of input with higher sensitivity is possible.

Another Structure Example

Figure 4B:
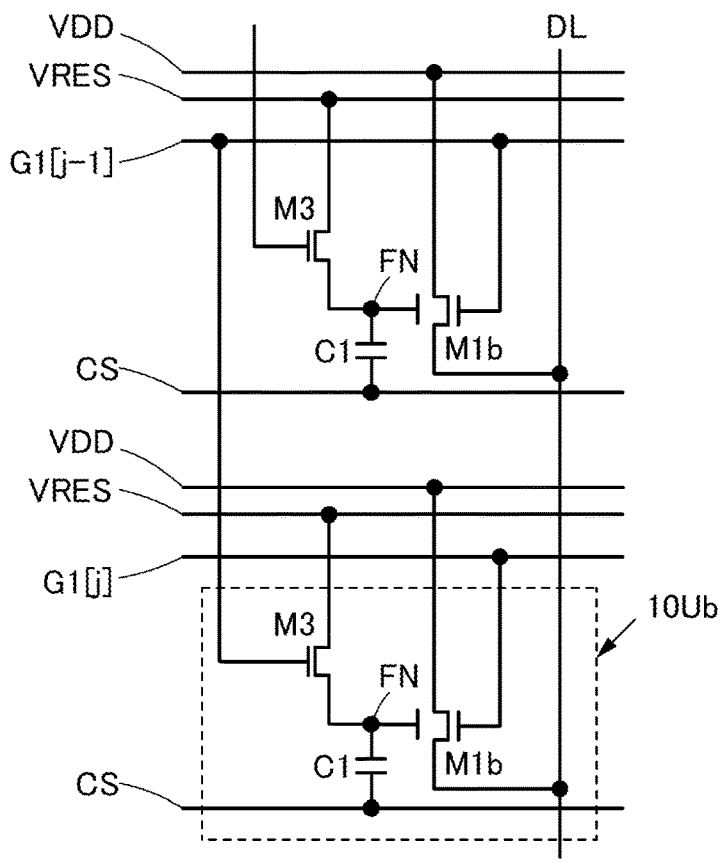

A gate of the transistor M3 in the sensing unit 10Ub may also be electrically connected to the wiring G1[j−1] (j is a natural number greater than or equal to 2) in the next row (see FIG. 4B). In addition, the wiring RES, which is provided in the circuit illustrated in FIG. 3A, can be omitted in the circuit illustrated in FIG. 4B; thus, the circuit configuration can be simplified and the area occupied by the sensing unit 10Ub can be reduced.

<Sensing Unit 10Up>

In the input device 100 described in this embodiment, an optical touch sensor can be used as the sensing unit.

A sensing unit 10Up illustrated in FIG. 5A includes the transistor M1b, the transistor M3, a transistor M6, a sensing element PD, and the node FN.

The sensing unit 10Up is electrically connected to the wiring VRES, the wiring RES, the wiring VDD, the wiring VPI, the wiring G1, the wiring DL, and a wiring SW.

The transistor M1b includes a first gate and a second gate. The first gate of the transistor M1b is electrically connected to the wiring G1, the second gate of the transistor M1b is electrically connected to the node FN, one of the source and the drain of the transistor M1b is electrically connected to the wiring DL, and the other of the source and the drain of the transistor M1b is electrically connected to the wiring VDD.

The gate of the transistor M3 is electrically connected to the wiring RES. One of the source and the drain of the transistor M3 is electrically connected to the node FN, and the other of the source and the drain of the transistor M3 is electrically connected to the wiring VRES.

A gate of the transistor M6 is electrically connected to the wiring SW, one of a source and a drain of the transistor M6 is electrically connected to the node FN, and the other of the source and the drain of the transistor M6 is electrically connected to a first terminal of the sensing element PD.

A second terminal of the sensing element PD is electrically connected to the wiring VPI.

The above description of the transistor M1b in the sensing unit 10Ub can be referred to for the detail of the transistor M1b.

The above description of the transistor M3 in the sensing unit 10U or the sensing unit 10Ub can be referred to for the detail of the transistor M3.

A transistor that can be formed through the same process as the transistor M3 can be selected as the transistor M6.

For the detail of the wiring G1, the wiring DL, the wiring VPI, the wiring RES, the wiring VRES, and the wiring VDD, the above description of the corresponding wirings in the sensing unit 10U or the sensing unit 10Ub can be referred to.

Through the wiring SW, a light exposure control signal can be supplied.

The sensing element PD includes a photoelectric conversion element. As the sensing element PD, for example, a photodiode can be used. Specifically, silicon can be used for a semiconductor layer. In particular, a photodiode in which p-type amorphous silicon, i-type amorphous silicon, and n-type amorphous silicon are stacked can be used favorably.

Next, a method for driving the sensing unit 10Up is described.

<<First Step>>

In a first step, a reset signal for turning on the transistor M3 and subsequently turning off the transistor M3 is supplied to the wiring RES, so that the potential of the node FN is set to a predetermined potential (see Period P1 in FIG. 5B-1).

<<Second Step>>

In a second step, a light exposure control signal for turning on the transistor M6 for a predetermined period is supplied to the wiring SW. Specifically, the wiring SW is made to supply a rectangular wave light exposure control signal so that the potential of the gate of the transistor M6 is set to a potential sufficiently higher than the threshold potential of the transistor M6 for a predetermined period (see Period P2 in FIG. 5B-1).

The electromotive force of the sensing element PD changes in accordance with the intensity of light with which the sensing element PD is irradiated. The current flowing through the sensing element PD changes depending on the electromotive force of the sensing element PD.

For example, in the case where the sensing element PD is irradiated with light, current flows in the sensing element PD, so that the potential of the node FN is decreased (see Period P2 in FIG. 5B-1).

In contrast, in the case where light with which the sensing element PD is irradiated is blocked, current does not flow in the sensing element PD, so that the potential of the node FN does not change (see Period P2 in FIG. 5B-2).

Specifically, the irradiation light is blocked by the approach or touch of an object such as a finger to the sensing element PD, leading to a reduction in the electromotive force of the sensing element PD.

The potential change of the node FN directly leads to a potential change of the second gate of the transistor M1b. The threshold voltage of the transistor M1b changes in response to a potential supplied to the second gate. For example, in the case where the potential of the node FN increases, the threshold voltage of the transistor M1b shifts in the negative direction. As a result, the on-state current when the transistor M1b is turned on increases. In contrast, in the case where the potential of the node FN decreases, the threshold voltage of the transistor M1b shifts in the positive direction. As a result, the on-state current when the transistor M1b is turned on decreases.

<<Third Step>>

In a third step, a selection signal for turning on the transistor M1b is supplied to the wiring G1 (see Period P3 in FIG. 5B-1).

<<Fourth Step>>

In a fourth step, a signal is supplied to the wiring DL. This signal includes, as data, the amount of change in the on-state current of the transistor M1b (current flowing between the wiring VDD and the wiring DL).

The converter CONV converts the amount of change in current flowing through the wiring DL into the amount of voltage change and supplied the amount of voltage change.

The input device 100 can detect the potential change of the node FN by reading the amount of the change in current, whereby the input device 100 can sense the approach or touch of a finger or the like.

<<Fifth Step>>

In a fifth step, a selection signal for turning off the transistor M1b is supplied to the gate of the transistor M1b.

The first to fifth steps are repeated for every row of the wirings G1(1) to G1 (n).

Another Structure Example

Figure 6:
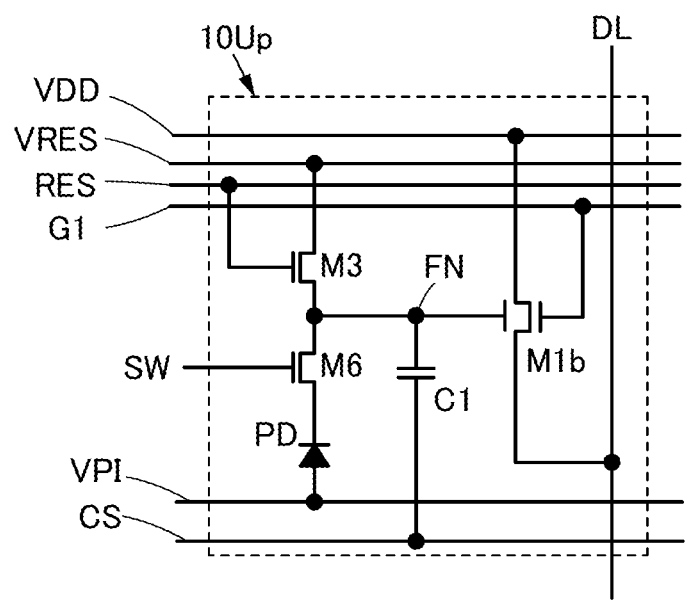
FIG. 6 illustrates an example of a circuit of a sensing unit.

Note that as illustrated in FIG. 6, the capacitor C1 and the wiring CS may be provided in the sensing unit 10Up illustrated in FIG. 5A. The capacitor C1 and the wiring CS can prevent an unintentional reduction in the potential of the node FN.

Figure 7:
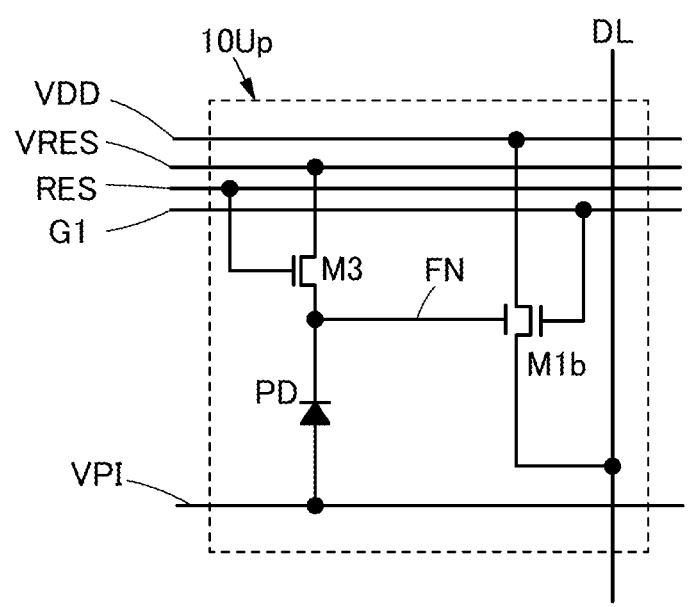
FIG. 7 illustrates an example of a circuit of a sensing unit.

As illustrated in FIG. 7, the transistor M6 and the wiring SW may be omitted in the sensing unit 10Up illustrated in FIG. 5A.

Like the sensing unit 10Ub, the sensing unit 10Up includes the transistor M1b, so that the area occupied by the sensing unit 10Up can be reduced, and an input device with higher resolution can be provided. In addition, since the sensing unit 10Up includes a small number of transistors, malfunction of circuit operation due to variation in threshold voltage among the transistors is less likely to occur. Thus, highly reliable sensing of input with higher sensitivity is possible.

The sensing units described in this embodiment are each preferably formed using a transistor that includes an oxide semiconductor in a channel (hereinafter, oxide semiconductor transistor). Since the oxide semiconductor transistor has small off-state current, leakage of charge retained in the node FN can be prevented and malfunction of the sensing unit can be prevented. The use of the oxide semiconductor transistor in the sensing unit enables a highly reliable input device with high detection sensitivity to be provided.

Note that the detail of the oxide semiconductor is described later in Embodiment 4.

When the input device described in this embodiment is electrically connected to a display portion, an input/output device can be obtained.

Examples of a display element that can be used for the display portion include display elements (electronic ink) that perform display by an electrophoretic method, an elec-trowetting method, or the like, MEMS shutter display elements, optical interference type MEMS display elements, liquid crystal elements, and organic electroluminescent elements.

Note that the display portion and the input device described in this embodiment may be formed over the same substrate, or may be formed over different substrates and then electrically connected to each other.

The use of the input device described in this embodiment enables a highly reliable input/output device with high detection sensitivity to be provided.

In this embodiment, one embodiment of the present invention has been described. Other embodiments of the present invention will be described in the other embodiments. Note that one embodiment of the present invention is not limited to the above embodiments. Although the examples in which one embodiment of the present invention is applied to the touch sensor, the input device, and the input/output device have been described, one embodiment of the present invention is not limited thereto. Depending on circumstances or conditions, one embodiment of the present invention does not need to be applied to a touch sensor, an input device, or the input/output device. For example, one embodiment of the present invention may be applied to a circuit with another function depending on circumstances or conditions.

This embodiment can be combined with any of the other embodiments in this specification as appropriate.

Embodiment 2

In this embodiment, an example of an input/output device in which the input device described in Embodiment 1 can be used is described with reference to FIG. 8 and FIGS. 9A to 9C.

Figure 8:
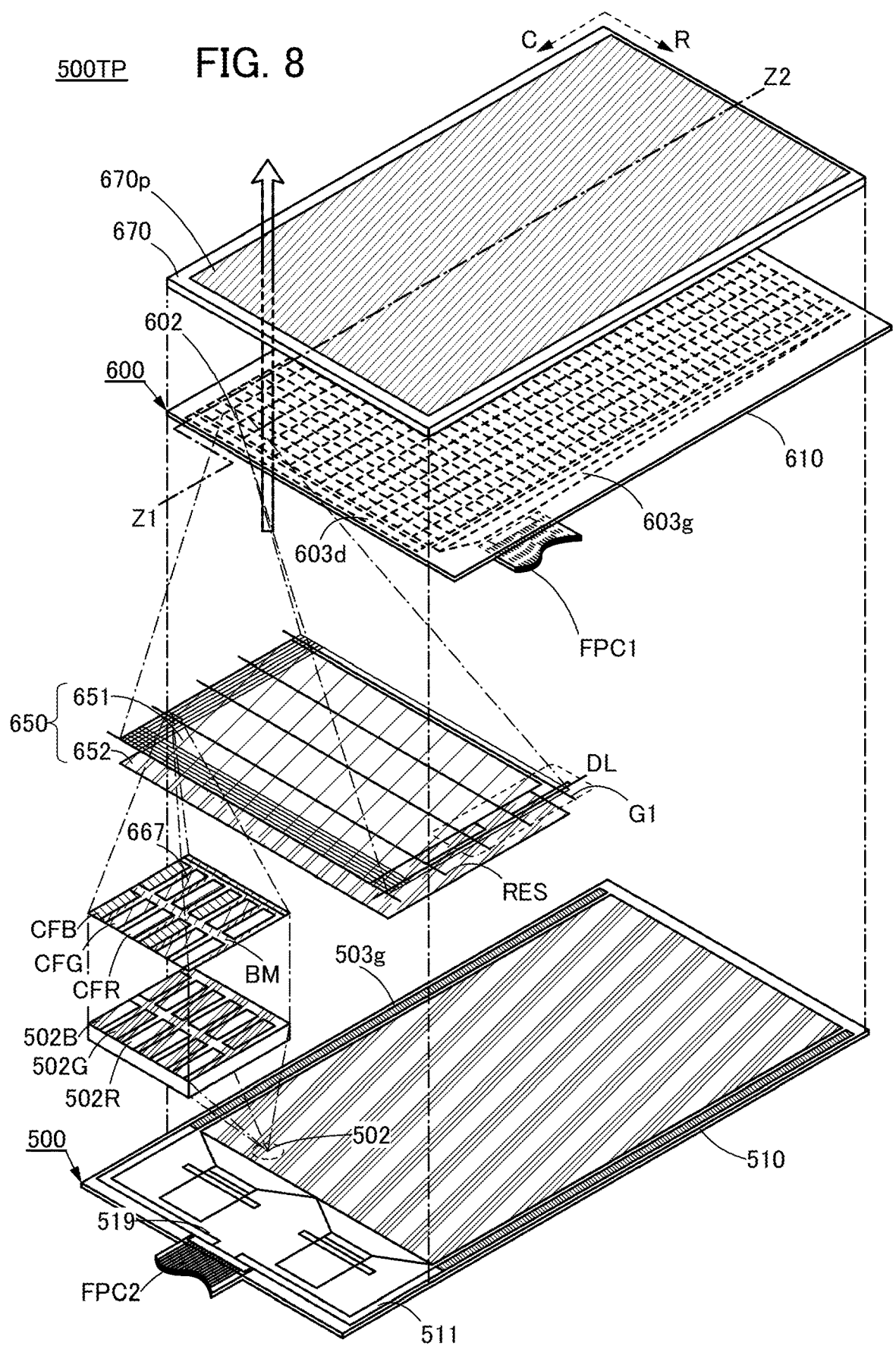
FIG. 8 is a projection view illustrating a structure of an input/output device of one embodiment.

FIG. 8 is a projection view illustrating a structure of an input/output device 500TP of one embodiment of the present invention. Note that part of a sensing unit 602 and part of a pixel 502 are enlarged for convenience of explanation.

Figure 9A:
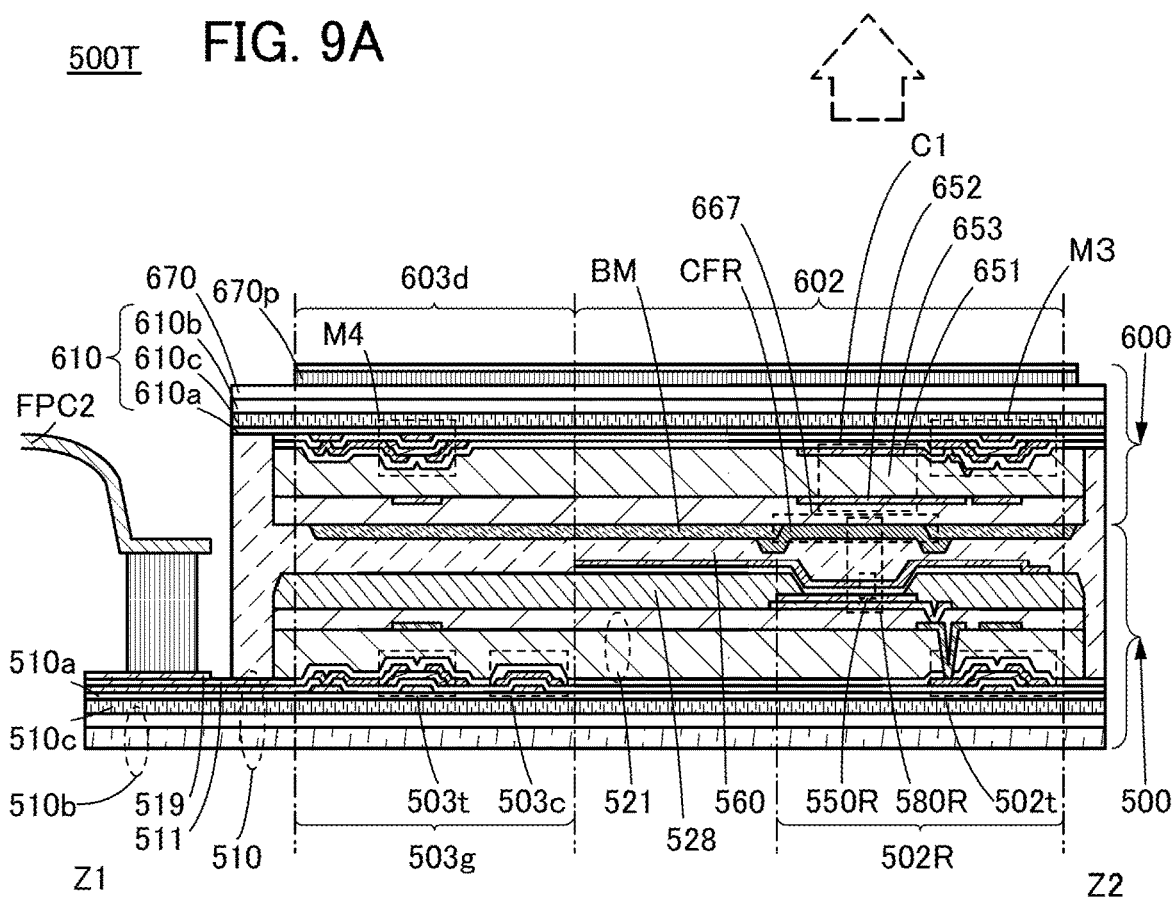
FIGS. 9A to 9C are cross-sectional views each illustrating a structure of an input/output device of one embodiment.
Figure 9B:
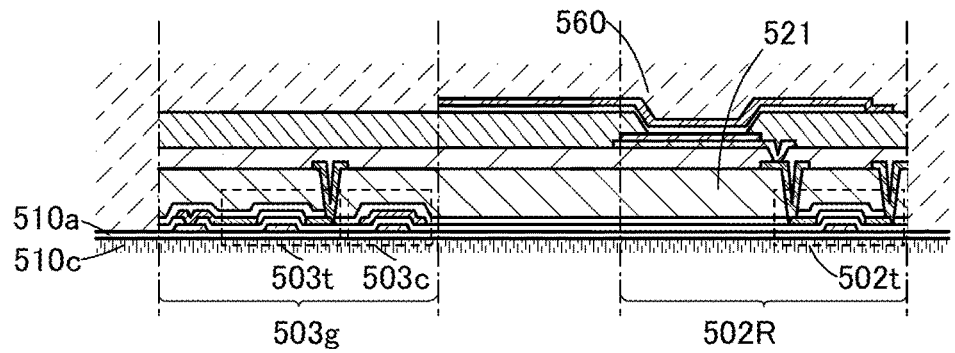
Figure 9C:
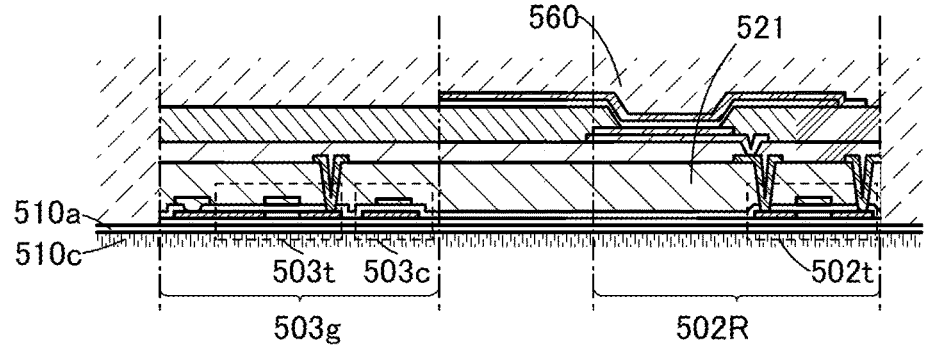

FIG. 9A is a cross-sectional view illustrating a structure of the input/output device 500TP of one embodiment of the present invention taken along Z1-Z2 in FIG. 8. FIGS. 9B and 9C are cross-sectional views each illustrating a modification example of part of the structure illustrated in FIG. 9A.

Structure Example of Input/Output Device

The input/output device 500TP described in this embodiment includes a display portion 500 and an input portion 600 overlapping with the display portion 500 (see FIG. 8).

Note that the input device described in Embodiment 1 can be used for the input portion 600.

The input portion 600 includes a plurality of sensing units 602 arranged in a matrix.

The plurality of sensing units 602 arranged in the row direction (denoted by an arrow R in FIG. 8) are electrically connected to the wiring G1, the wiring RES, and the like.

The plurality of sensing units 602 arranged in the column direction (denoted by an arrow C in FIG. 8) are electrically connected to the wiring DL or the like.

Note that any of the sensing units described in Embodiment 1 can be used as the sensing unit 602.

The sensing unit 602 is provided with a sensing circuit. The sensing circuit is electrically connected to the wiring G1, the wiring RES, the wiring DL, and the like.

A transistor, a sensing element, and/or the like can be used for the sensing circuit. For example, a conductive film and a capacitor electrically connected to the conductive film can be used for the sensing element. Alternatively, for example, a photoelectric conversion element such as a photodiode can be used for the sensing element. Note that an example in which a capacitor is used for the sensing element is described in this embodiment.

A capacitor C1 that includes an insulating layer 653, and a first electrode 651 and a second electrode 652 between which the insulating layer 653 is sandwiched can be used (see FIG. 9A).

The sensing unit 602 includes a plurality of window portions 667 arranged in a matrix. The window portion 667 transmits visible light. A light-blocking layer BM may be provided between the plurality of window portions 667.

A coloring layer is provided in a position overlapping with the window portion 667. The coloring layer transmits light of a predetermined color. Note that the coloring layer can be referred to as a color filter. For example, a coloring layer CFB that transmits blue light, a coloring layer CFG that transmits green light, or a coloring layer CFR that transmits red light can be used. Alternatively, a coloring layer that transmits yellow light or white light may be used.

The display portion 500 includes the plurality of pixels 502 arranged in a matrix. The pixel 502 is provided to overlap with the window portions 667 of the input portion 600.

The pixels 502 may be arranged at higher density than the sensing units 602.

The input/output device 500TP described in this embodiment includes the input portion 600 that includes the plurality of sensing units 602 arranged in a matrix and provided with the window portions 667 transmitting visible light, the display portion 500 that includes the plurality of pixels 502 overlapping with the window portions 667, and the coloring layers between the window portions 667 and the pixels 502. Each of the sensing units includes a switch that can reduce interference in another sensing unit.

With such a structure, sensing data sensed by each sensing unit can be supplied together with the positional data of the sensing unit. In addition, the sensing data associated with the positional data of the pixel for displaying an image can be supplied. In addition, the sensing unit that does not supply the sensing data is not electrically connected to a signal line, whereby interference with the sensing unit that supplies a sensing signal can be reduced. Consequently, the novel input/output device 500TP that is highly convenient or reliable can be provided.

For example, the input portion 600 of the input/output device 500TP can sense sensing data and supply the sensing data together with the positional data. Specifically, a user of the input/output device 500TP can make a variety of gestures (e.g., tap, drag, swipe, and pinch-in operation) using, as a pointer, his/her finger or the like on the input portion 600.

The input portion 600 can sense a finger or the like that approaches or touches the input portion 600 and supply sensing data including the sensed position, track, or the like.

An arithmetic unit determines whether or not supplied data satisfies a predetermined condition on the basis of a program or the like and executes an instruction associated with a predetermined gesture. Furthermore, the arithmetic unit has a function of supplying a result of executing the instruction as display data to the display portion 500.

Thus, a user of the input portion 600 can make the predetermined gesture with his/her finger and make the arithmetic unit execute an instruction associated with the predetermined gesture.

For example, the input portion 600 of the input/output device 500TP is capable of selecting one sensing unit from a plurality of sensing units that can supply sensing data to one signal line to cause a non-conduction state between the signal line and all sensing units except the selected one. This can reduce interference of the non-selected sensing units with the selected sensing unit.

Specifically, interference of the sensing elements of the non-selected sensing units with the sensing element of the selected sensing unit can be reduced.

For example, in the case where a capacitor and a conductive film to which one electrode of the capacitor is electrically connected are used in a sensing element, interference of the potential of a conductive film of a non-selected sensing unit with the potential of a conductive film of a selected sensing unit can be reduced.

Thus, the input/output device 500TP can drive the sensing unit and supply sensing data independently of its size. The input/output device 500TP can have a variety of sizes, for example, ranging from a size for a hand-held device to a size for an electronic blackboard.

In addition, the input/output device 500TP can drive the sensing unit and supply sensing data independently of its state. Specifically, the input/output device 500TP in a variety of states, such as a folded state and an unfolded state, can be obtained.

In addition to the above structure, the input/output device 500TP can have the following structure.

The input portion 600 of the input/output device 500TP may include a driver circuit 603g or a driver circuit 603d. The input/output device 500TP may be electrically connected to a flexible printed board FPC1.

The display portion 500 of the input/output device 500TP may include a scan line driver circuit 503g, a wiring 511, and a terminal 519. The input/output device 500TP may be electrically connected to a flexible printed circuit FPC2.

In addition, a protective layer 670 that prevents damage and protects the input/output device 500TP may be provided. For example, a ceramic coat layer or a hard coat layer can be used as the protective layer 670. Specifically, a layer containing aluminum oxide or a UV curable resin can be used. In addition, an anti-reflection layer 670p that weakens the intensity of external light reflected by the input/output device 500TP can be used. Specifically, a circular polarizing plate or the like can be used.

Individual components included in the input/output device 500TP are described below. Note that these components cannot be clearly distinguished and one component also serves as another component or include part of another component in some cases.

For example, the input portion 600 including the coloring layers overlapping with the plurality of window portions 667 also serves as a color filter.

Furthermore, for example, the input/output device 500TP in which the input portion 600 overlaps with the display portion 500 serves as the input portion 600 and the display portion 500. Note that the input/output device 500TP in which the input portion 600 overlaps with the display portion 500 is also referred to as a touch panel.

<<Overall Structure>>

The input/output device 500TP described in this embodiment includes the input portion 600 and the display portion 500.

<<Input Portion>>

The input portion 600 includes the sensing unit 602, the wiring G1, the wiring DL, and a base 610.

Note that the input portion 600 may be formed in such a manner that films for forming the input portion 600 are deposited over the base 610 and the films are processed.

Alternatively, the input portion 600 may be formed in such a manner that part of the input portion 600 is formed over another base and the part is transferred to the base 610.

<<Sensing Unit>>

The sensing unit 602 senses an object that approaches or touches the sensing unit 602 and supplies a sensing signal. For example, the sensing unit 602 senses capacitance, illuminance, magnetic force, a radio wave, pressure, or the like and supplies data based on the sensed physical quantity. Specifically, a capacitor, a photoelectric conversion element, a magnetic sensing element, a piezoelectric element, a resonator, or the like can be used as a sensing element.

The sensing unit 602 senses, for example, a change in capacitance between the sensing unit 602 and an object that approaches or touches the sensing unit 602. Specifically, a conductive film and a sensing circuit electrically connected to the conductive film may be used.

Note that when an object having a higher dielectric constant than the air, such as a finger, approaches or touches the conductive film in the air, electrostatic capacitance between the finger and the conductive film changes. The sensing unit 602 can sense the change in capacitance and supply sensing data. Specifically, a sensing circuit including a conductive film and a capacitor one electrode of which is connected to the conductive film can be used for the sensing unit 602.

For example, the capacitance change causes charge distribution between the capacitor and the finger, leading to voltage change across the capacitor. This voltage change can be used for a sensing signal. Specifically, the voltage between the electrodes of the capacitor C1 changes when an object approaches or touches the conductive film that is electrically connected to one electrode of the capacitor C1 (see FIG. 9A).

<<Switch, Transistor>>

The sensing unit 602 includes a switch that can be turned on or off on the basis of a control signal. For example, a transistor M3 can be used as the switch.

A transistor that amplifies a sensing signal can be used in the sensing unit 602.

Transistors that can be formed through the same process can be used as the transistor that amplifies a sensing signal and the switch. This allows the input portion 600 to be manufactured through a simplified process.

The transistor includes a semiconductor layer. For example, a Group 14 element, a compound semiconductor, or an oxide semiconductor can be used for the semiconductor layer. Specifically, a semiconductor containing silicon, a semiconductor containing gallium arsenide, an oxide semiconductor containing indium, or the like can be used for the semiconductor layer.

Transistors can include semiconductor layers with a variety of crystallinities. For example, a semiconductor layer containing non-crystal, a semiconductor layer containing microcrystal, a semiconductor layer containing polycrystal, a semiconductor layer containing single crystal, and the like can be used. Specifically, a semiconductor layer containing amorphous silicon, a semiconductor layer containing polysilicon obtained by crystallization process such as laser annealing, a semiconductor layer formed by silicon on insulator (SOI) technique, and the like can be used.

The oxide semiconductor used for the semiconductor layer preferably includes, for example, a film represented by an In-M-Zn oxide that contains at least indium (In), zinc (Zn), and M (metal such as Al, Ga, Ge, Y, Zr, Sn, La, Ce, or Hf). Alternatively, both In and Zn are preferably contained.

Examples of a stabilizer include gallium (Ga), tin (Sn), hafnium (Hf), aluminum (Al), and zirconium (Zr). Other examples of the stabilizer include lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As an oxide semiconductor included in an oxide semiconductor film, any of the followings can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, and an In—Ga-based oxide.

Note that here, for example, an "In—Ga—Zn-based oxide" means an oxide containing In, Ga, and Zn as its main components and there is no limitation on the ratio of In to Ga and Zn. The In—Ga—Zn-based oxide may contain a metal element other than In, Ga, and Zn.

<<Wiring>>

The input portion 600 includes the wiring G1, the wiring RES, the wiring DL, and the like.

A conductive material can be used for the wiring G1, the wiring RES, the wiring DL, and the like.

For example, an inorganic conductive material, an organic conductive material, metal, conductive ceramics, or the like can be used for the wirings.

Specifically, a metal element selected from aluminum, gold, platinum, silver, chromium, tantalum, titanium, molybdenum, tungsten, nickel, iron, cobalt, yttrium, zirconium, palladium, and manganese; an alloy including any of the above metal elements; an alloy including any of the above metal elements in combination; or the like can be used for the wirings. In particular, one or more elements selected from aluminum, chromium, copper, tantalum, titanium, molybdenum, and tungsten are preferably included. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used.

Alternatively, a stacked structure in which an alloy film or a nitride film that contains one or more elements selected from titanium, tantalum, tungsten, molybdenum, chromium, neodymium, and scandium is stacked over an aluminum film may be used.

Alternatively, a conductive oxide such as indium oxide, indium tin oxide, indium zinc oxide, zinc oxide, or zinc oxide to which gallium is added can be used.

Alternatively, graphene or graphite can be used. A film including graphene can be formed by, for example, reducing a film containing graphene oxide. As a reducing method, a method using heat, a method using a reducing agent, or the like can be employed.

Alternatively, a conductive macromolecule can be used.

<<Driver Circuit>>

The driver circuit 603g can supply selection signals at predetermined timings, for example. Specifically, the driver circuit 603g supplies selection signals to the wirings G1 in a predetermined order. Any of a variety of circuits can be used as the driver circuit 603g. For example, a shift register, a flip-flop circuit, a combination circuit, or the like can be used.

The driver circuit 603d supplies sensing data on the basis of a sensing signal supplied from the sensing unit 602. Any of a variety of circuits can be used as the driver circuit 603d. For example, a circuit that can form a source follower circuit or a current mirror circuit by being electrically connected to the sensing circuit in the sensing unit 602 can be used as the driver circuit 603d. In addition, an analog-to-digital converter circuit that converts a sensing signal into a digital signal may be provided.

<<Base>>

There is no particular limitation on the base 610 as long as the base 610 has heat resistance high enough to withstand a manufacturing process and a thickness and a size that can be used in a manufacturing apparatus. In particular, use of a flexible material as the base 610 enables the input portion 600 to be folded or unfolded. Note that in the case where the input portion 600 is positioned on the side where the display portion 500 displays an image, a light-transmitting material is used as the base 610.

For the base 610, an organic material, an inorganic material, a composite material of an organic material and an inorganic material, or the like can be used.

For example, an inorganic material such as glass, a ceramic, or a metal can be used for the base 610.

Specifically, non-alkali glass, soda-lime glass, potash glass, crystal glass, or the like can be used for the base 610.

Specifically, a metal oxide film, a metal nitride film, a metal oxynitride film, or the like can be used for the base 610. For example, silicon oxide, silicon nitride, silicon oxynitride, an alumina film, or the like can be used for the base 610.

For example, an organic material such as a resin, a resin film, or plastic can be used for the base 610.

Specifically, a resin film or resin plate of polyester, polyolefin, polyamide, polyimide, polycarbonate, an acrylic resin, or the like can be used for the base 610.

For example, a composite material such as a resin film to which a thin glass plate or a film of an inorganic material is attached can be used for the base 610.

For example, a composite material formed by dispersing a fibrous or particulate metal, glass, inorganic material, or the like into a resin film can be used for the base 610.

For example, a composite material formed by dispersing a fibrous or particulate resin, organic material, or the like into an inorganic material can be used for the base 610.

A single-layer material or a stacked-layer material including a plurality of layers can be used for the base 610. For example, a stacked-layer material including a base and an insulating layer that prevents diffusion of impurities contained in the base can be used for the base 610.

Specifically, a stacked-layer material including glass and one or a plurality of films that prevent diffusion of impurities contained in the glass and that are selected from a silicon oxide film, a silicon nitride film, a silicon oxynitride film, and the like can be used for the base 610.

Alternatively, a stacked-layer material including a resin and a film that prevents diffusion of impurities contained in the resin, such as a silicon oxide film, a silicon nitride film, or a silicon oxynitride film can be used for the base 610.

Specifically, a stack including a flexible base 610*b*, a barrier film 610*a* preventing diffusion of impurities, and a resin layer 610*c* attaching the base 610*b* to the barrier film 610*a* can be used (see FIG. 9A).

<<Flexible Printed Circuit>>

The flexible printed circuit FPC1 supplies a timing signal, a power supply potential, or the like and is supplied with a sensing signal.

<<Display Portion>>

The display portion 500 includes the pixels 502, scan lines, signal lines, and a base 510 (see FIG. 8).

Note that the display portion 500 may be formed in such a manner that films for forming the display portion 500 are deposited over the base 510 and the films are processed.

The display portion 500 may be formed in such a manner that part of the display portion 500 is formed over another base and the part is transferred to the base 510.

<<Pixel>>

The pixel 502 includes a sub-pixel 502B, a sub-pixel 502G, and a sub-pixel 502R, and each sub-pixel includes a display element and a pixel circuit for driving the display element.

<<Pixel Circuit>>

An active matrix method in which an active element is included in a pixel or a passive matrix method in which an active element is not included in a pixel can be employed for the display portion.

In an active matrix method, as an active element (a non-linear element), not only a transistor but also various active elements (non-linear elements) can be used. For example, a metal insulator metal (MIM), a thin film diode (TFD), or the like can also be used. Since these elements can be formed with a smaller number of manufacturing steps, manufacturing cost can be reduced or yield can be improved. Alternatively, since the size of the element is small, the aperture ratio can be improved, leading to lower power consumption or higher luminance.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, leading to lower power consumption, higher luminance, or the like.

The pixel circuit includes, for example, a transistor 502*t*.

The display portion 500 includes an insulating film 521 that covers the transistor 502*t*. The insulating film 521 can be used as a layer for planarizing unevenness caused by the pixel circuits. A stacked-layer film including a layer that can prevent diffusion of impurities can be used as the insulating film 521. This can prevent decrease of the reliability of the transistor 502*t* or the like due to diffusion of impurities.

<<Display Element>>

Various display elements can be used for the display portion 500. For example, display elements (electronic ink) that perform display by an electrophoretic method, an elec-trowetting method, or the like, MEMS shutter display elements, optical interference type MEMS display elements, and liquid crystal elements can be used.

Furthermore, a display element that can be used for a transmissive liquid crystal display, a transflective liquid crystal display, a reflective liquid crystal display, a direct-view liquid crystal display, or the like can be used.

For example, organic electroluminescent elements that emit light of different colors may be included in subpixels.

For example, an organic electroluminescent element that emits white light can be used.

For example, a light-emitting element 550R includes a lower electrode, an upper electrode, and a layer containing a light-emitting organic compound between the lower electrode and the upper electrode.

The sub-pixel 502R includes a light-emitting module 580R. The sub-pixel 502R includes the light-emitting element 550R and the pixel circuit that can supply electric power to the light-emitting element 550R and includes a transistor 502*t*. The light-emitting module 580R includes the light-emitting element 550R and an optical element (e.g., the coloring layer CFR).

Note that a micro resonator can be provided in the light-emitting module 580R so that light with a particular wavelength can be extracted efficiently. Specifically, a layer containing a light-emitting organic compound may be provided between a film that reflects visible light and a film that partly reflects and partly transmits visible light, which are provided so that light with a particular wavelength can be efficiently extracted.

The light-emitting module 580R includes the coloring layer CFR on the light extraction side. The coloring layer transmits light with a particular wavelength and can be, for example, a layer that selectively transmits red, green, or blue light. Note that other sub-pixels may be provided so as to overlap with the window portions, which are not provided with the coloring layers, so that light from the light-emitting element can be emitted without passing through the coloring layers.

The coloring layer CFR overlaps with the light-emitting element 550R. Accordingly, part of light emitted from the light-emitting element 550R passes through the coloring layer CFR and is emitted to the outside of the light-emitting module 580R as indicated by an arrow in FIG. 9A.

The light-blocking layer BM is located so as to surround the coloring layer (e.g., the coloring layer CFR).

Note that in the case where a sealant 560 is provided on the light extraction side, the sealant 560 may be in contact with the light-emitting element 550R and the coloring layer CFR.

The lower electrode is provided over the insulating film 521. A partition wall 528 with an opening overlapping with the lower electrode is provided. Note that part of the partition wall 528 overlaps with an end portion of the lower electrode.

The lower electrode, the upper electrode, and the layer containing a light-emitting organic compound provided between the lower electrode and the upper electrode form the light-emitting element (e.g., the light-emitting element 550R). The pixel circuit supplies electric power to the light-emitting element.

In addition, a spacer that controls the gap between the base 610 and the base 510 is provided on the partition wall 528.

In the case of a transflective liquid crystal display or a reflective liquid crystal display, some of or all of pixel electrodes function as reflective electrodes. For example, some or all of pixel electrodes are formed to contain aluminum, silver, or the like.

A memory circuit such as an SRAM can be provided under the reflective electrodes. Thus, the power consumption can be further reduced. A structure suitable for employed display elements can be selected from a variety of structures of pixel circuits.

<<Base>>

A flexible material can be used for the base 510. For example, a material that is similar to the material that can be used for the base 610 can be used for the base 510.

Note that in the case where the base 510 does not need a light-transmitting property, for example, a non-light-transmitting base such as SUS or aluminum can be used.

For example, a stack including a flexible base layer 510*b*, a barrier film 510*a* that prevents diffusion of impurities, and a resin layer 510*c* attaching the barrier film 510*a* to the base layer 510*b* can be preferably used for the base 510 (see FIG. 9A).

<<Sealant>>

The sealant 560 has a function of bonding the base 610 to the base 510. The sealant 560 preferably has higher refractive index than the air. Note that the pixel circuits and the light-emitting elements (e.g., the light-emitting element 550R) are provided between the base 510 and the base 610.

<<Configuration of Scan Line Driver Circuit>>

The scan line driver circuit 503*g* supplies a selection signal. The scan line driver circuit 503*g* includes a transistor 503*t* and a capacitor 503*c*. Note that transistors used in the pixel circuit and the driver circuit can be formed through the same process and over the same substrate.

<<Wiring>>

The display portion 500 includes wirings such as scan lines, signal lines, and power supply lines. Various conductive films can be used. For example, a conductive film similar to the conductive film that can be used for the input portion 600 can be used.

The display portion 500 includes a wiring 511 through which a signal can be supplied. The wiring 511 is provided with a terminal 519. Note that the flexible printed circuit FPC2 through which a signal such as an image signal or a synchronization signal can be supplied is electrically connected to the terminal 519.

Note that a printed wiring board (PWB) may be attached to the flexible printed circuit FPC2.

Modification Example of Input/Output Device

Any of various kinds of transistors can be used in the input portion 600 and/or the display portion 500.

FIG. 9A illustrates a structure in which bottom-gate transistors are used in the input portion 600.

FIGS. 9A and 9B illustrate a structure in which bottom-gate transistors are used in the display portion 500.

For example, a semiconductor layer containing an oxide semiconductor, amorphous silicon, or the like can be used in the transistor 502*t* and the transistor 503*t* illustrated in FIG. 9A.

For example, a semiconductor layer containing polycrystalline silicon that is obtained by crystallization process such as laser annealing can be used in the transistor 502*t* and the transistor 503*t* illustrated in FIG. 9B.

FIG. 9C illustrates a structure in which top-gate transistors are used in the display portion 500.

For example, a semiconductor layer containing polycrystalline silicon, a single crystal silicon film that is transferred from a single crystal silicon substrate, or the like can be used in the transistor 502*t* and the transistor 503*t* illustrated in FIG. 9C.

This embodiment can be combined with any of the other embodiments in this specification as appropriate.

Embodiment 3

In this embodiment, electronic appliances and lighting devices in which the input device or the input/output device of one embodiment of the present invention can be used are described with reference to FIGS. 10A to 10F and FIGS. 11A to 11I.

The input device or the input/output device of one embodiment of the present invention is flexible and thus can be suitably used in flexible electronic appliances and lighting devices. Furthermore, according to one embodiment of the present invention, an electronic appliance and a lighting device that have high reliability and high resistance to repeated bending can be achieved.

Examples of electronic appliances include a television set (also referred to as television or television receiver), a monitor of a computer or the like, a camera such as a digital camera and a digital video camera, a digital photo frame, a mobile phone (also referred to as a cellular phone or mobile phone device), a portable game machine, a portable information terminal, an audio reproducing device, and a large game machine such as a pachinko machine.

The input device and input/output device of one embodiment of the present invention have flexibility and therefore can be incorporated along a curved inside/outside wall surface of a house or a building or a curved interior/exterior surface of a car.

Figure 10A:
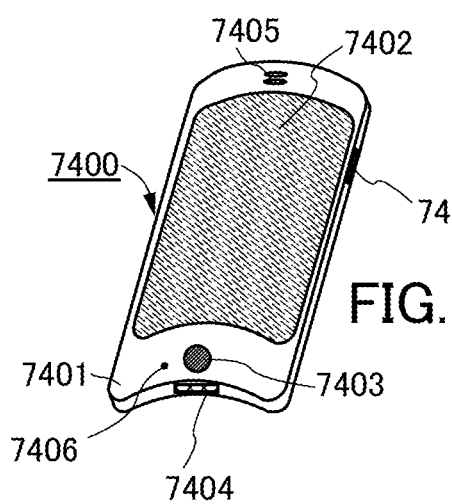
FIGS. 10A to 10F illustrate electronic appliances and lighting devices.

FIG. 10A illustrates an example of a mobile phone. A mobile phone 7400 includes a display portion 7402 incorporated in a housing 7401, operation buttons 7403, an external connection port 7404, a speaker 7405, a microphone 7406, and the like. Note that the mobile phone 7400 is manufactured by using the input device or the input/output device of one embodiment of the present invention for the display portion 7402. According to one embodiment of the present invention, a highly reliable mobile phone having a curved display portion can be provided with a high yield.

When the display portion 7402 of the mobile phone 7400 in FIG. 10A is touched with a finger or the like, data can be input into the mobile phone 7400. Operations such as making a call and inputting letters can be performed by touch on the display portion 7402 with a finger or the like.

With the operation buttons 7403, power ON or OFF can be switched. In addition, types of images displayed on the display portion 7402 can be switched; for example, the image can be switched from a mail creation screen to a main menu.

Figure 10B:
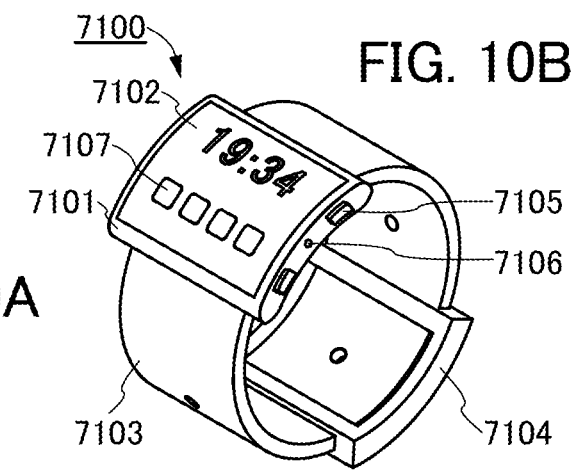

FIG. 10B illustrates an example of a wrist-watch-type portable information terminal A portable information terminal 7100 includes a housing 7101, a display portion 7102, a band 7103, a buckle 7104, an operation button 7105, an input/output terminal 7106, and the like.

The portable information terminal 7100 is capable of executing a variety of applications such as mobile phone calls, e-mailing, reading and editing texts, music reproduction, Internet communication, and a computer game.

The display surface of the display portion 7102 is curved, and images can be displayed on the curved display surface. The display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as time setting, power on/off, on/off control of wireless communication, setting and cancellation of manner mode, and setting and cancellation of power saving mode can be performed. For example, the functions of the operation button 7105 can be set freely by the operating system incorporated in the portable information terminal 7100.

The portable information terminal 7100 can employ near field communication, which is a communication method based on an existing communication standard. In that case, for example, hands-free calling is possible with mutual communication between the portable information terminal 7100 and a headset capable of wireless communication.

Since the portable information terminal 7100 includes the input/output terminal 7106, data can be directly transmitted to and received from another information appliance via a connector. Charging through the input/output terminal 7106 is possible. Note that the charging operation may be performed by wireless power feeding without using the input/output terminal 7106.

The display portion 7102 of the portable information terminal 7100 includes the input device or the input/output device of one embodiment of the present invention. According to one embodiment of the present invention, a highly reliable portable information terminal having a curved display portion can be provided with a high yield.

Figure 10C:
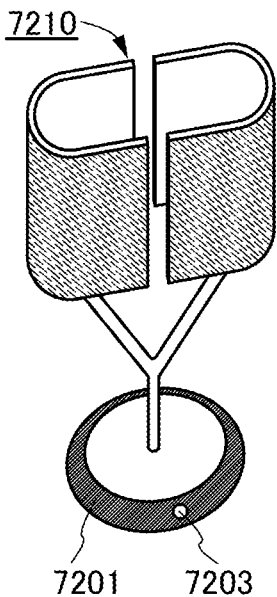

FIG. 10C illustrates an example of a lighting device. A lighting device 7210 includes a stage 7201 provided with an operation switch 7203 and a light-emitting portion supported by the stage 7201.

The light-emitting portion included in the lighting device 7210 is flexible; thus, the light-emitting portion may be fixed on a plastic member, a movable frame, or the like so that an emission surface of the light-emitting portion can be bent freely depending on the intended use.

Although the lighting devices in which the light-emitting portion is supported by the stage are described as examples, a housing provided with a light-emitting portion can be fixed on a ceiling or suspended from a ceiling. Since the light-emitting surface can be curved, the light-emitting surface can be bent concavely so that a particular region is brightly illuminated, or bent convexly so that the whole room is brightly illuminated.

Here, each of the light-emitting portions includes the input device or the input/output device of one embodiment of the present invention. According to one embodiment of the present invention, a highly reliable lighting device having a curved display portion can be provided with a high yield.

Figure 10D:
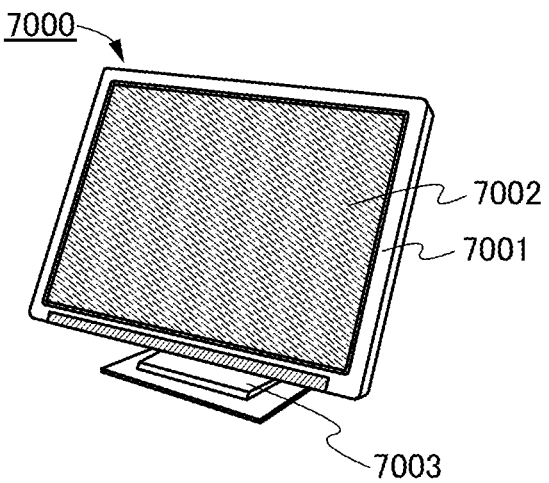

An electronic appliance and a lighting device in which the input device or the input/output device of one embodiment of the present invention is used are not limited to those having flexibility. FIG. 10D illustrates an example of a display device. A display device 7000 includes a housing 7001, a display portion 7002, a support base 7003, and the like. The input device or the input/output device of one embodiment of the present invention can be incorporated in the display portion 7002. Note that the display device 7000 includes all of display devices for displaying information such as those for personal computers, television broadcast reception, and advertisement display.

Figure 10E:
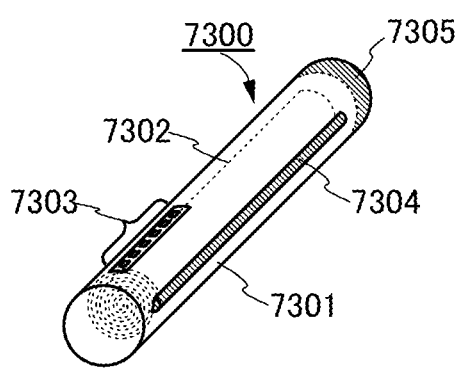

FIG. 10E illustrates an example of a portable touch panel. A touch panel 7300 includes a housing 7301, a display portion 7302, operation buttons 7303, a display portion pull 7304, and a control portion 7305.

The touch panel 7300 includes a rolled flexible display portion 7102 in the cylindrical housing 7301.

The touch panel 7300 can receive a video signal with the control portion 7305 and can display the received video on the display portion 7302. In addition, a battery is included in the control portion 7305. Moreover, the control portion 7305 may include a terminal portion for connecting a connector so that a video signal or power can be directly supplied from the outside through a wire.

By pressing the operation buttons 7303, power on/off, switching of displayed video, and the like can be performed.

Figure 10F:
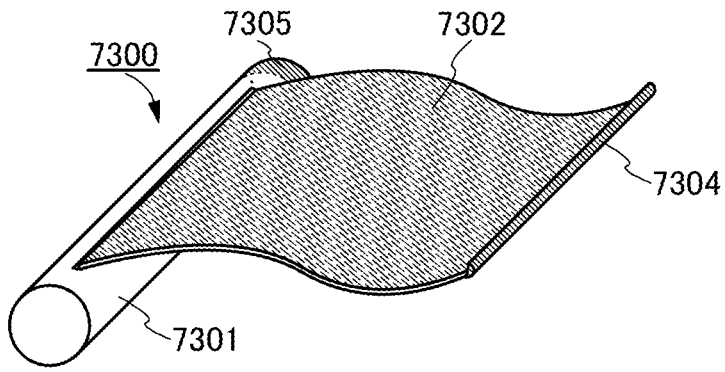

FIG. 10F illustrates a touch panel 7300 in a state where the display portion 7302 is pulled out with the display portion pull 7304. Videos can be displayed on the display portion 7302 in this state. The operation buttons 7303 on the surface of the housing 7301 allow one-handed operation. The operation buttons 7303 are provided not in the center of the housing 7301 but on one side of the housing 7301 as illustrated in FIG. 10E, which makes one-handed operation easy.

A reinforcement frame may be provided for a side portion of the display portion 7302 so that the display portion 7302 has a flat display surface when pulled out.

Note that in addition to this structure, the housing may be provided with a speaker so that sound is output with an audio signal received together with a video signal.

The display portion 7302 includes the input device or the input/output device of one embodiment of the present invention. According to one embodiment of the present invention, a lightweight and highly reliable touch panel can be provided with a high yield.

Figure 11A:
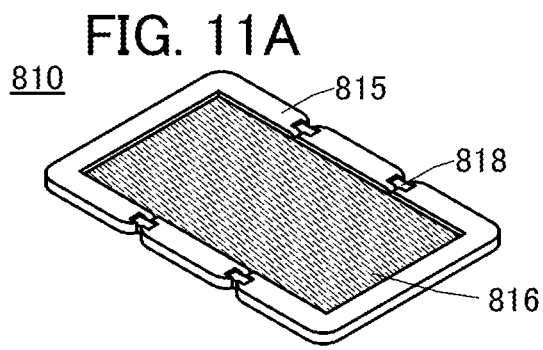
FIGS. 11A to 11I illustrate examples of lighting devices.
Figure 11B:
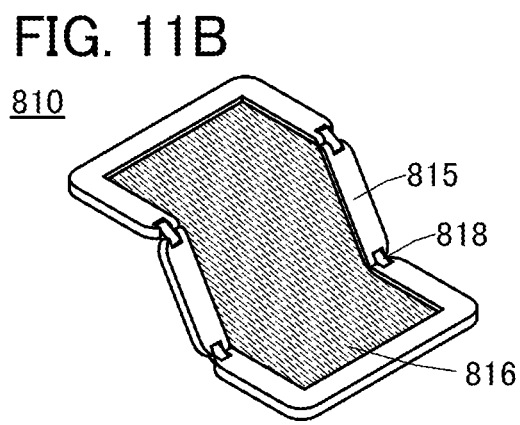
Figure 11C:
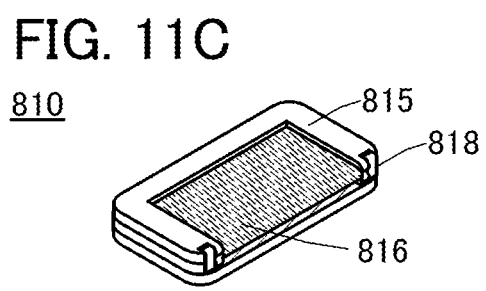

FIGS. 11A to 11C illustrate a foldable portable information terminal 810. FIG. 11A illustrates the portable information terminal 810 that is opened. FIG. 11B illustrates the portable information terminal 810 that is being opened or being folded. FIG. 11C illustrates the portable information terminal 810 that is folded. The portable information terminal 810 is highly portable when folded, and is highly browsable when opened because of a seamless large display area.

A display panel 816 is supported by eight housings 815 joined together by hinges 818. By folding the portable information terminal 810 at a connection portion between two housings 815 with the hinges 818, the portable information terminal 810 can be reversibly changed in shape from an opened state to a folded state. The input device or the input/output device of one embodiment of the present invention can be used for the display panel 816. For example, it is possible to use a touch panel that can be bent with a radius of curvature of 1 mm or more and 150 mm or less.

Note that in one embodiment of the present invention, a sensor that senses whether the touch panel is in a folded state or an unfolded state and supplies sensing data may be used. The operation of a folded portion (or a portion that becomes invisible by a user by folding) of the touch panel may be stopped by a control device through the acquisition of data indicating the folded state of the touch panel. Specifically, display of the portion may be stopped, and furthermore, sensing by the touch sensor may be stopped.

Similarly, the control device of the touch panel may acquire data indicating the unfolded state of the touch panel to resume displaying and sensing by the touch sensor.

Figure 11D:
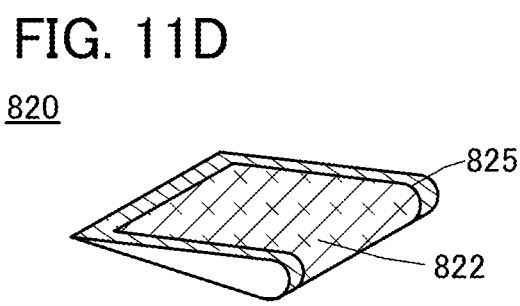
Figure 11E:
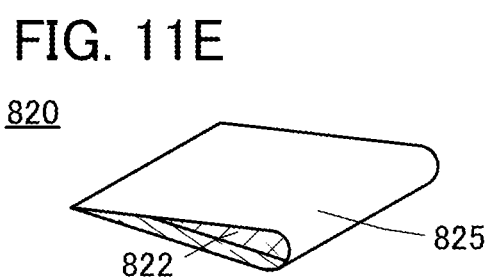

FIGS. 11D and 11E each illustrate a foldable portable information terminal 820. FIG. 11D illustrates the portable information terminal 820 that is folded so that a display portion 822 is on the outside. FIG. 11E illustrates the portable information terminal 820 that is folded so that the display portion 822 is on the inside. When the portable information terminal 820 is not used, the portable information terminal 820 is folded so that a non-display portion 825 faces the outside, whereby the display portion 822 can be prevented from being contaminated or damaged. The input device or the input/output device of one embodiment of the present invention can be used for the display portion 822.

Figure 11F:
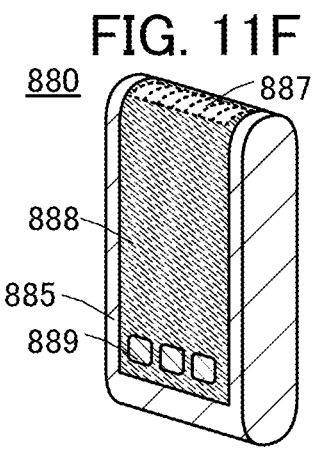
Figure 11G:
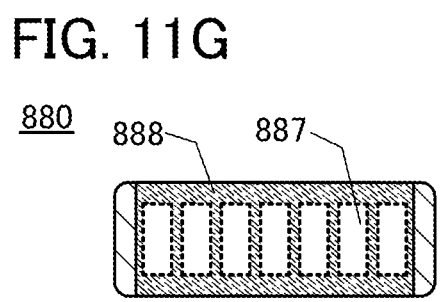
Figure 11H:
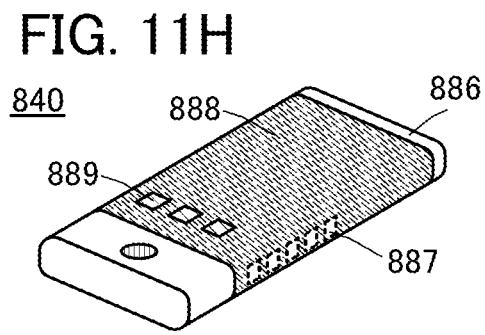

FIG. 11F is a perspective view illustrating an external shape of the portable information terminal 880. FIG. 11G is a top view of the portable information terminal 880. FIG. 11H is a perspective view illustrating an external shape of a portable information terminal 840.

The portable information terminals 840 and 880 each function as, for example, one or more of a telephone set, a notebook, and an information browsing system. Specifically, the portable information terminals 840 and 880 each can be used as a smartphone.

The portable information terminals 880 and 840 can display characters and image information on its plurality of surfaces. For example, eight operation buttons 889 can be displayed on one surface (FIGS. 11F and 11H). In addition, information 887 indicated by dashed rectangles can be displayed on another surface (FIGS. 11G and 11H). Examples of the information 887 include notification of a social networking service (SNS) message, display indicating reception of an email or an incoming call, the title of an e-mail or the like, the sender of an email or the like, the date, the time, remaining battery, and the reception strength of an antenna. Alternatively, the operation buttons 889, an icon, or the like may be displayed in place of the information 887. Although FIGS. 11F and 11G illustrate an example in which the information 887 is displayed at the top, one embodiment of the present invention is not limited thereto. The information 887 may be displayed, for example, on the side as in the portable information terminal 840 illustrated in FIG. 11H.

For example, a user of the portable information terminal 880 can see the display (here, the information 887) with the portable information terminal 880 put in a breast pocket.

Specifically, a caller's phone number, name, or the like of an incoming call is displayed in a position that can be seen from above the portable information terminal 880. Thus, the user can see the display without taking out the portable information terminal 880 from the pocket and decide whether to answer the call.

The input device or the input/output device of one embodiment of the present invention can be used for a display portion 888 included in each of a housing 885 of the portable information terminal 880 and a housing 886 of the portable information terminal 840. According to one embodiment of the present invention, a highly reliable touch panel having a curved display portion can be provided with a high yield.

Figure 11I:
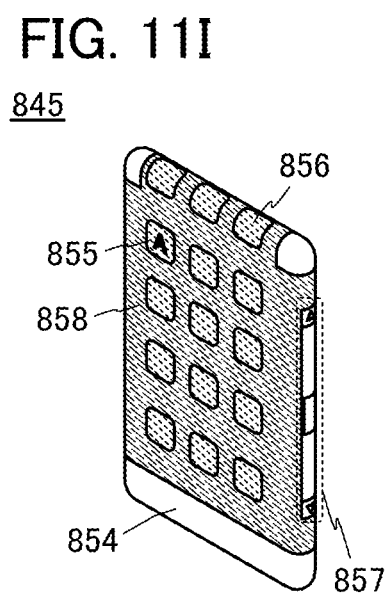

As in a portable information terminal 845 illustrated in FIG. 11I, information may be displayed on eight or more surfaces. Here, as an example, information 855, information 856, and information 857 are displayed on different surfaces.

The input device or the input/output device of one embodiment of the present invention can be used for a display portion 858 included in a housing 854 of the portable information terminal 845. According to one embodiment of the present invention, a highly reliable touch panel having a curved display portion can be provided with a high yield.

The structure described above in this embodiment can be combined as appropriate with any of the structures described in the other embodiments.

Embodiment 4

In this embodiment, a structure of an oxide semiconductor transistor that can be used for the input/output device of one embodiment of the present invention is described with reference to FIGS. 12A to 12C.

Figure 12A:
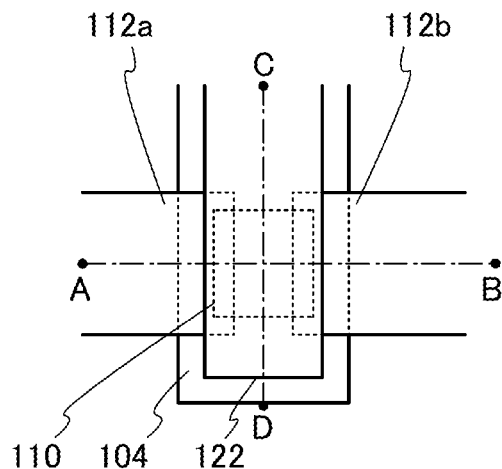
FIGS. 12A to 12C are a top view and cross-sectional views of a transistor as an example.
Figure 12C:
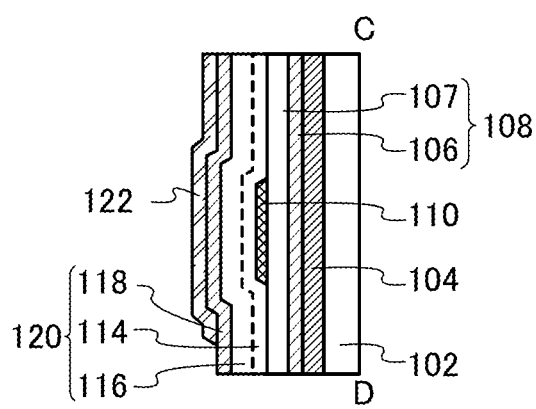
Figure 12B:
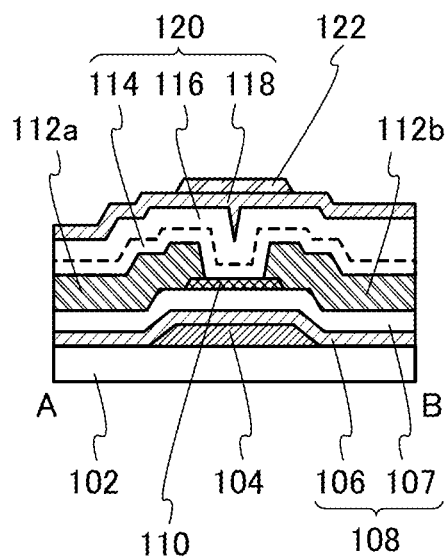

FIGS. 12A to 12C are a top view and cross-sectional views of a transistor 151. FIG. 12A is a top view of the transistor 151, FIG. 12B is a cross-sectional view taken along dashed-dotted line A-B in FIG. 12A, and FIG. 12C is a cross-sectional view taken along dashed-dotted line C-D in FIG. 12A. Note that in FIG. 12A, some components are not illustrated for clarity.

The transistor 151 includes an electrode 104 provided over a substrate 102, an insulating film 108 that includes insulating films 106 and 107 and is formed over the substrate 102 and the electrode 104, an oxide semiconductor film 110 overlapping the electrode 104 with the insulating film 108 therebetween, and an electrode 112*a* and an electrode 112*b* in contact with the oxide semiconductor film 110.

In addition, over the insulating film 108, the oxide semiconductor film 110, the electrode 112*a*, and the electrode 112*b*, an insulating film 120 including insulating films 114, 116, and 118 and an electrode 122 formed over the insulating film 120 are provided.

The electrode 104 functions as a first gate electrode of the transistor 151, and the electrode 122 functions as a second electrode of the transistor 151. Note that the electrode 122 may be provided as necessary and can be omitted in some cases.

Note that the insulating film 108 functions as a first gate insulating film of the transistor 151, and the insulating film 120 functions as a second gate insulating film of the transistor 151.

The electrode 112*a* functions as one of a source and a drain of the transistor 151, and the electrode 112*b* functions as the other of the source and the drain of the transistor 151.

The electrode 104 and the electrode 122 may be supplied with different potentials or the same potential. The electrode 104 and the electrode 122 may be electrically connected to each other through an opening formed in the insulating film 120.

When the electrode 104 and the electrode 122 have the same potential, carriers flow in a wide region of the oxide semiconductor film 110. Accordingly, the amount of carriers that move in the transistor 151 increases.

As a result, the on-state current of the transistor 151 is increased, and the field-effect mobility is increased. Typically, the field-effect mobility is greater than or equal to 10 $cm^2/V \cdot s$ or greater than or equal to 20 $cm^2/V \cdot s$. Note that here, the field-effect mobility is not an approximate value of the mobility as the physical property of the oxide semiconductor film but is the apparent field-effect mobility in a saturation region of the transistor, which is an indicator of current drive capability.

An increase in the field-effect mobility becomes significant when the channel length (also referred to as L length) of the transistor is longer than or equal to 0.5 μm and shorter than or equal to 6.5 μm, preferably longer than 1 μm and shorter than 6 μm, further preferably longer than 1 μm and shorter than or equal to 4 μm, still further preferably longer than 1 μm and shorter than or equal to 3.5 μm, yet still further preferably longer than 1 μm and shorter than or equal to 2.5 μm. Furthermore, with a short channel length longer than or equal to 0.5 μm and shorter than or equal to 6.5 μm, the channel width can also be short.

The electrode 104 and the electrode 122 each have a function of blocking an external electric field; thus, fixed charges between the substrate 102 and the electrode 104 and over the electrode 122 do not affect the oxide semiconductor film 110. Thus, degradation due to a stress test (e.g., a negative gate bias temperature (−GBT) stress test in which a negative potential is applied to a gate electrode) can be reduced, and changes in the rising voltages of on-state current at different drain voltages can be suppressed.

The BT stress test is one kind of accelerated test and can evaluate, in a short time, change in characteristics (i.e., a change over time) of transistors, which is caused by long-term use. In particular, the amount of change in threshold voltage of the transistor between before and after the BT stress test is an important indicator when examining the reliability of the transistor. If the amount of change in the threshold voltage between before and after the BT stress test is small, the transistor has higher reliability.

The substrate 102 and individual components included in the transistor 151 are described below.

<<Substrate 102>>

For the substrate 102, a glass material such as aluminosilicate glass, aluminoborosilicate glass, or barium borosilicate glass is used. In the mass production, a mother glass with any of the following sizes is preferably used for the substrate 102: the 8th generation (2160 mm×2460 mm); the 9th generation (2400 mm×2800 mm, or 2450 mm×3050 mm); the 10th generation (2950 mm×3400 mm); and the like. High process temperature and a long period of process time drastically shrink the mother glass. Thus, in the mass production using the mother glass, heat treatment in the manufacturing process is preferably performed at lower than or equal to 600° C., further preferably lower than or equal to 450° C., and still further preferably lower than or equal to 350° C.

<<Electrode 104, Electrode 122>>

As a material for the electrode 104 and the electrode 122, a metal element selected from aluminum, chromium, copper, tantalum, titanium, molybdenum, and tungsten, an alloy containing any of these metal elements as a component, an alloy containing these metal elements in combination, or the like can be used. Alternatively, an oxide containing indium can be used as a material for the electrode 104 and the electrode 122. For example, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used. The material for the electrode 104 and the electrode 122 may have a single-layer structure or a stacked-layer structure of two or more layers. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used. The material for the electrode 104 and the electrode 122 can be formed by, for example, a sputtering method.

<<Insulating Film 108>>

An example in which the insulating film 108 has a two-layer structure of the insulating film 106 and the insulating film 107 is illustrated. Note that the structure of the insulating film 108 is not limited thereto, and for example, the insulating film 108 may have a single-layer structure or a stacked-layer structure including three or more layers.

The insulating film 106 is formed with a single-layer structure or a stacked-layer structure using, for example, any of a silicon nitride oxide film, a silicon nitride film, an aluminum oxide film, and the like with a PE-CVD apparatus. In the case where the insulating film 106 has a stacked-layer structure, it is preferable that a silicon nitride film with fewer defects be provided as a first silicon nitride film, and a silicon nitride film from which hydrogen and ammonia are less likely to be released be provided over the first silicon nitride film, as a second silicon nitride film. As a result, hydrogen and nitrogen contained in the insulating film 106 can be inhibited from moving or diffusing into the oxide semiconductor film 110 to be formed later.

The insulating film 107 is formed with a single-layer structure or a stacked-layer structure using any of a silicon oxide film, a silicon oxynitride film, and the like with a PE-CVD apparatus.

The insulating film 108 can have a stacked-layer structure, for example, in which a 400-nm-thick silicon nitride film used as the insulating film 106 and a 50-nm-thick silicon oxynitride film used as the insulating film 107 are formed in this order. The silicon nitride film and the silicon oxynitride film are preferably formed in succession in a vacuum, in which case entry of impurities is suppressed. The insulating film 108 in a position overlapping with the electrode 104 functions as a gate insulating film of the transistor 151. Note that silicon nitride oxide refers to an insulating material that contains more nitrogen than oxygen, whereas silicon oxynitride refers to an insulating material that contains more oxygen than nitrogen.

<<Oxide Semiconductor Film 110>>

For the oxide semiconductor film 110 an oxide semiconductor is preferably used. As the oxide semiconductor, a film represented by an In-M-Zn oxide that contains at least indium (In), zinc (Zn), and M (a metal such as Al, Ga, Ge, Y, Zr, Sn, La, Ce, or Hf) is preferably included. Alternatively, both In and Zn are preferably contained. In order to reduce fluctuations in electrical characteristics of the transistors including the oxide semiconductor, the oxide semiconductor preferably contains a stabilizer in addition to In and Zn.

Examples of a stabilizer include gallium (Ga), tin (Sn), hafnium (Hf), aluminum (Al), zirconium (Zr). Other examples of the stabilizer include lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor included in the oxide semiconductor film 110, any of the following can be used: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In to Ga and Zn. The In—Ga—Zn-based oxide may contain a metal element other than In, Ga, and Zn.

The oxide semiconductor film 110 can be formed by a sputtering method, a molecular beam epitaxy (MBE) method, a CVD method, a pulse laser deposition method, an atomic layer deposition (ALD) method, or the like as appropriate. In particular, the oxide semiconductor film 110 is preferably formed by a sputtering method, in which case the oxide semiconductor film 110 can be dense.

In the formation of an oxide semiconductor film as the oxide semiconductor film 110, the hydrogen concentration in the oxide semiconductor film is preferably reduced as much as possible. In order to reduce the hydrogen concentration, for example, in the case of a sputtering method, a deposition chamber needs to be highly evacuated and a sputtering gas also needs to be highly purified. As an oxygen gas or an argon gas used as a sputtering gas, a gas that is highly purified to have a dew point of −40° C. or lower, preferably −80° C. or lower, further preferably −100° C. or lower, still further preferably −120° C. or lower is used, whereby entry of moisture or the like into the oxide semiconductor film can be prevented as much as possible.

In order to remove moisture remaining in the deposition chamber, an entrapment vacuum pump such as a cryopump, an ion pump, or a titanium sublimation pump is preferably used. The evacuation unit may be a turbo molecular pump provided with a cold trap. When the deposition chamber is evacuated with a cryopump, which has high capability of removing a compound containing a hydrogen atom such as water ($H_2O$) (preferably a compound containing a carbon atom) and the like, the concentration of impurities in an oxide semiconductor film formed in the deposition chamber can be reduced.

When the oxide semiconductor film as the oxide semiconductor film 110 is formed by a sputtering method, the relative density (filling factor) of a metal oxide target that is used for the film formation is greater than or equal to 90% and less than or equal to 100%, preferably greater than or equal to 95% and less than or equal to 100%. With the use of the metal oxide target having high relative density, a dense oxide film can be formed.

Note that to reduce the impurity concentration of the oxide semiconductor film, it is also effective to form the oxide semiconductor film as the oxide semiconductor film 110 while the substrate 102 is kept at high temperature. The heating temperature of the substrate 102 may be higher than or equal to 150° C. and lower than or equal to 450° C., and preferably the substrate temperature is higher than or equal to 200° C. and lower than or equal to 350° C.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. The first heat treatment can improve the crystallinity of the oxide semiconductor that is used for the oxide semiconductor film 110 and further remove impurities such as hydrogen and water from the insulating film 108 and the oxide semiconductor film 110. The first heat treatment may be performed before the oxide semiconductor film 110 is processed into an island shape.

A transistor in which an oxide semiconductor from which impurities such as hydrogen and water are removed as described above is used for a channel formation region has very low off-state current. In the case where the voltage between a source and a drain is set at, for example, approximately 0.1 V, 5 V, or 10 V, the off-state current standardized on the channel width of the transistor can be as low as several yoctoamperes per micrometer to several zeptoamperes per micrometer.

<<Electrode 112a, Electrode 112b>>

The electrode 112a and the electrode 112b can be formed using a conductive film 112 having a single-layer structure or a stacked-layer structure including any of metals such as aluminum, titanium, chromium, nickel, copper, yttrium, zirconium, molybdenum, silver, tantalum, and tungsten, or an alloy containing any of these metals as its main component. In particular, one or more elements selected from aluminum, chromium, copper, tantalum, titanium, molybdenum, and tungsten are preferably contained. For example, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. The conductive film can be formed by, for example, a sputtering method.

<<Insulating Films 114 and 116>>

An example in which the insulating film 120 has a three-layer structure of the insulating films 114, 116, and 118 is illustrated. Note that the structure of the insulating film 120 is not limited thereto, and for example, the insulating film 120 may have a single-layer structure or a stacked-layer structure including two layers or four or more layers.

For the insulating films 114 and 116, an inorganic insulating material containing oxygen can be used in order to improve the characteristics of the interface with the oxide semiconductor used for the oxide semiconductor film 110. As examples of the inorganic insulating material containing oxygen, a silicon oxide film, a silicon oxynitride film, and the like can be given. The insulating films 114 and 116 can be formed by, for example, a PE-CVD method.

The thickness of the insulating film 114 can be greater than or equal to 5 nm and less than or equal to 150 nm, preferably greater than or equal to 5 nm and less than or equal to 50 nm, more preferably greater than or equal to 10 nm and less than or equal to 30 nm. The thickness of the insulating film 116 can be greater than or equal to 30 nm and less than or equal to 500 nm, preferably greater than or equal to 150 nm and less than or equal to 400 nm.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to thereto. For example, a single-layer structure of the insulating film 114, a single-layer structure of the insulating film 116, or a stacked-layer structure including three or more layers may be used.

The insulating film 118 is a film formed using a material that can prevent an external impurity, such as water, alkali metal, or alkaline earth metal, from diffusing into the oxide semiconductor film 110, and that further contains hydrogen.

For example, a silicon nitride film, a silicon nitride oxide film, or the like having a thickness of greater than or equal to 150 nm and less than or equal to 400 nm can be used as the insulating film 118. In this embodiment, a 150-nm-thick silicon nitride film is used as the insulating film 118.

The silicon nitride film is preferably formed at a high temperature to have an improved blocking property against impurities or the like; for example, the silicon nitride film is preferably formed at a temperature in the range from the substrate temperature of 100° C. to the strain point of the substrate, more preferably at a temperature in the range from 300° C. to 400° C. When the silicon nitride film is formed at a high temperature, a phenomenon in which oxygen is released from the oxide semiconductor used for the oxide semiconductor film 110 and the carrier concentration is increased is caused in some cases; therefore, the upper limit of the temperature is a temperature at which the phenomenon is not caused.

The structures, methods, and the like described in this embodiment can be used in appropriate combination with any of the structures, methods, and the like described in the other embodiments.

This application is based on Japanese Patent Application serial No. 2014-122090 filed with the Japan Patent Office on Jun. 13, 2014, the entire contents of which are hereby incorporated by reference.

What is claimed is:

1. A semiconductor device comprising:
a first sensing unit comprising a first transistor, a second transistor, a first capacitor, and a first node;
a second sensing unit comprising a third transistor, a fourth transistor, a second capacitor, and a second node;
a first wiring;
a second wiring;
a third wiring; and
a fourth wiring,
wherein each of the first transistor and the third transistor comprises a first gate and a second gate,
wherein the first gate of the first transistor and the second gate of the first transistor overlap with each other with a semiconductor film therebetween,
wherein the second gate of the first transistor is electrically connected to the first node,
wherein the first wiring is electrically connected to the second wiring through the first transistor,
wherein the third wiring is electrically connected to the first node through the second transistor,
wherein a first terminal of the first capacitor is electrically connected to the first node,
wherein a second terminal of the first capacitor is electrically connected to the fourth wiring,
wherein the second gate of the third transistor is electrically connected to the second node,
wherein the first wiring is electrically connected to the second wiring through the third transistor,
wherein the third wiring is electrically connected to the second node through the fourth transistor,
wherein a first terminal of the second capacitor is electrically connected to the second node,
wherein a second terminal of the second capacitor is electrically connected to the fourth wiring,
wherein one of a source and a drain of the first transistor is directly connected to the first wiring, and
wherein one of a source and a drain of the third transistor is directly connected to the first wiring.

2. The semiconductor device according to claim 1,
wherein a potential of the first node changes by the approach or touch of a finger,
wherein a threshold voltage of the first transistor changes by a change in the potential of the first node,
wherein current flowing between the first wiring and the second wiring changes by a change in the threshold voltage of the first transistor, and
wherein an input can be sensed by reading a change in the current flowing between the first wiring and the second wiring.

3. The semiconductor device according to claim 1, wherein the first transistor and the second transistor comprise an oxide semiconductor in a channel.

4. An input/output device comprising:
the semiconductor device according to claim 1; and
a display portion.

5. An electronic appliance comprising:
the semiconductor device according to claim 1; and
at least one of a microphone, a speaker, and an operation button.

6. A semiconductor device comprising:
a first sensing unit comprising a first transistor, a second transistor, a third transistor, a first photodiode, and a first node;
a first wiring;
a second wiring;
a third wiring; and
a fourth wiring,
wherein the first transistor comprises a first gate and a second gate,
wherein the first gate of the first transistor and the second gate of the first transistor overlap with each other with a semiconductor film therebetween,
wherein the second gate of the first transistor is electrically connected to the first node,
wherein the first wiring is electrically connected to the second wiring through the first transistor,
wherein the third wiring is electrically connected to the first node through the second transistor,
wherein a first terminal of the first photodiode is electrically connected to the first node through the third transistor, and
wherein a second terminal of the first photodiode is electrically connected to the fourth wiring.

7. The semiconductor device according to claim 6,
wherein a potential of the first node changes when a finger blocks light with which the first photodiode is irradiated,
wherein a threshold voltage of the first transistor changes by a change in the potential of the first node, wherein current flowing between the first wiring and the second wiring changes by a change in the threshold voltage of the first transistor, and wherein an input can be sensed by reading a change in the current flowing between the first wiring and the second wiring.

8. The semiconductor device according to claim 6, wherein the first transistor to the third transistor comprise an oxide semiconductor in a channel.

9. An input/output device comprising:
the semiconductor device according to claim 6; and
a display portion.

10. An electronic appliance comprising:
the semiconductor device according to claim 6; and
at least one of a microphone, a speaker, and an operation button.

* * * * *